United States Patent [19]

Houkawa et al.

[11] Patent Number: 4,482,821

[45] Date of Patent: Nov. 13, 1984

[54] SUPERCONDUCTIVE LOGIC CIRCUIT

[75] Inventors: Kouji Houkawa, Iruma; Akira Ishida; Masaru Okada, both of Tokyo, all of Japan

[73] Assignee: Nippon Telegraph & Telephone Public Corporation, Tokyo, Japan

[21] Appl. No.: 269,874

[22] Filed: Jun. 3, 1981

[30] Foreign Application Priority Data

| Jun. 10, 1980 | [JP] | Japan | 55-78082 |
| Feb. 9, 1981 | [JP] | Japan | 56-17678 |
| Feb. 9, 1981 | [JP] | Japan | 56-17679 |
| Feb. 9, 1981 | [JP] | Japan | 56-17680 |
| Feb. 9, 1981 | [JP] | Japan | 56-17681 |
| Feb. 9, 1981 | [JP] | Japan | 56-17682 |

[51] Int. Cl.$^3$ .......................................... H03K 19/195
[52] U.S. Cl. ..................... 307/462; 307/306; 307/476
[58] Field of Search ............... 307/462, 476, 306; 357/5; 365/162

[56] References Cited

U.S. PATENT DOCUMENTS

| 4,275,314 | 6/1981 | Fulton | 307/462 |
| 4,313,066 | 1/1982 | Gheewala | 307/462 |

FOREIGN PATENT DOCUMENTS 24468 3/1981 European Pat. Off. .

OTHER PUBLICATIONS

IBM Technical Disclosure Bulletin, vol. 23, No. 7B, Dec., 1980, pp. 3402-3403.
IEEE Transactions on Magnetics, vol. Mag-15, No. 6, Nov. 1979, pp. 1876-1879.
2419 Japanese Journal of Appl. Physics, vol. 19 (1980) Suppl. 19-1, Tokyo, Japan, pp. 607-611.

*Primary Examiner*—John Zazworsky
*Attorney, Agent, or Firm*—Frishauf, Holtz, Goodman & Woodward

[57] ABSTRACT

A basic logic circuit of a superconductive logic circuit comprises a bridge circuit of four branches wherein first and second terminals are connected at least at two nodes and an output terminal is connected at least at a node. One branch of the bridge circuit comprises a series circuit consisting of a first resistor and a first Josephson junction connected between the first and second input terminals. The second branch comprises a parallel circuit of a second Josephson junction and a second resistor connected between the first input terminal and a grounding terminal of the bridge circuit. The third branch comprises a third resistor connected between the second input terminal and the output terminal. The fourth branch comprises a third junction connected between the output terminal and the grounding terminal. A load resistor is connected between the output terminal and the ground.

29 Claims, 30 Drawing Figures

F I G. 13
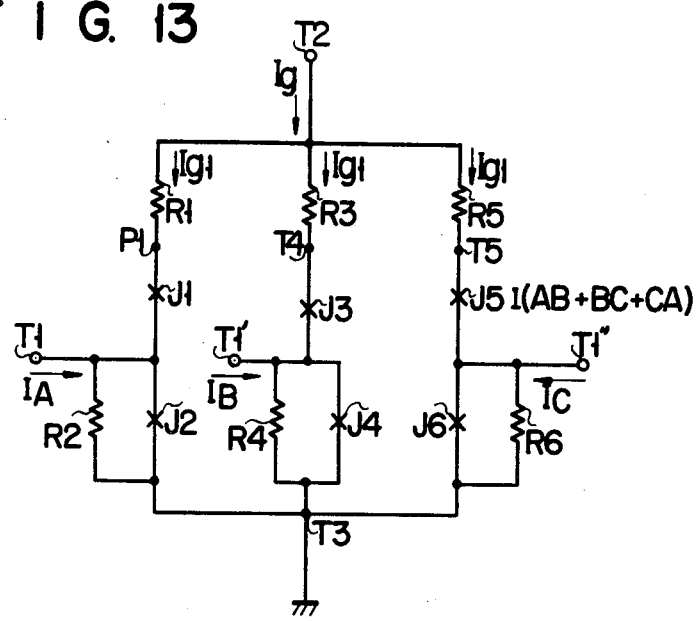
F I G. 14
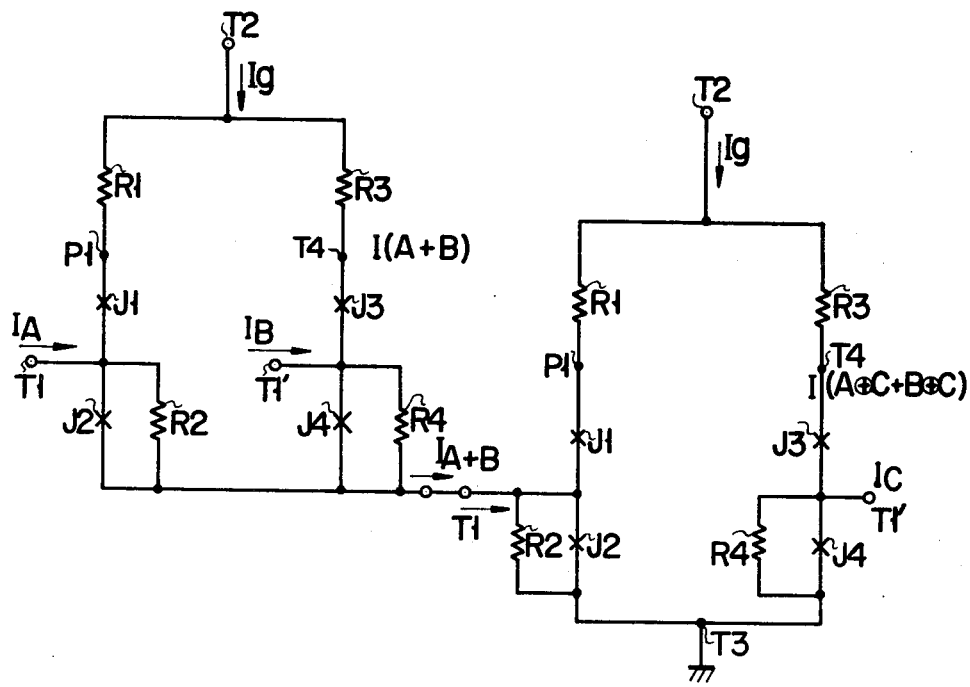

F I G. 17
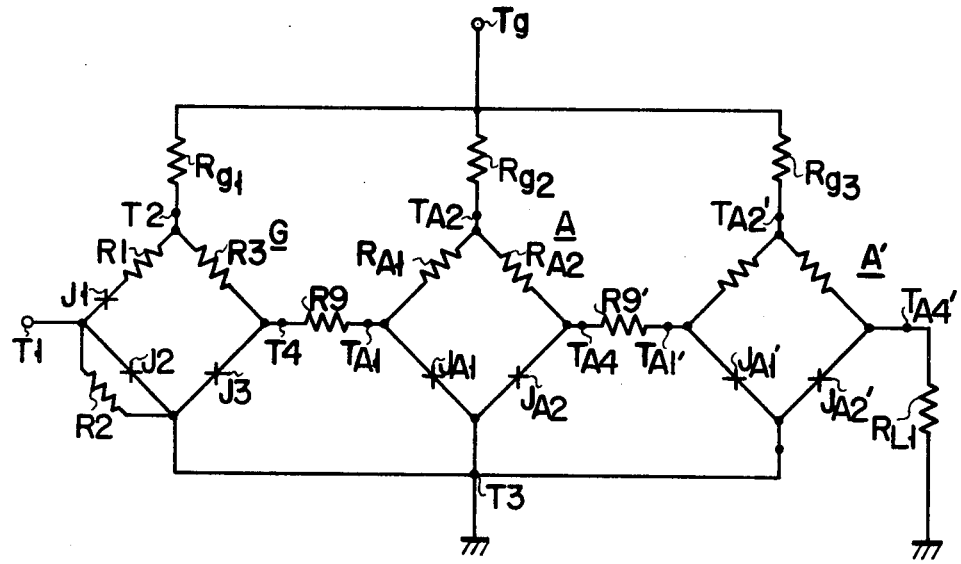
F I G. 18
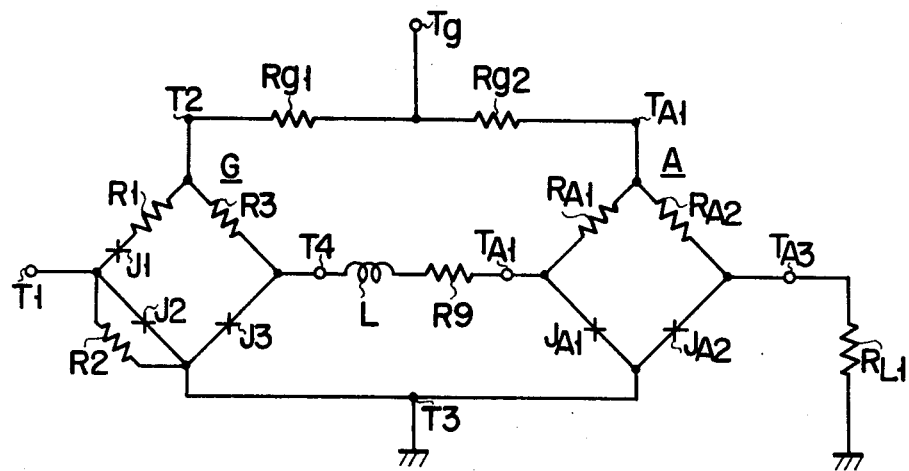

F I G. 21
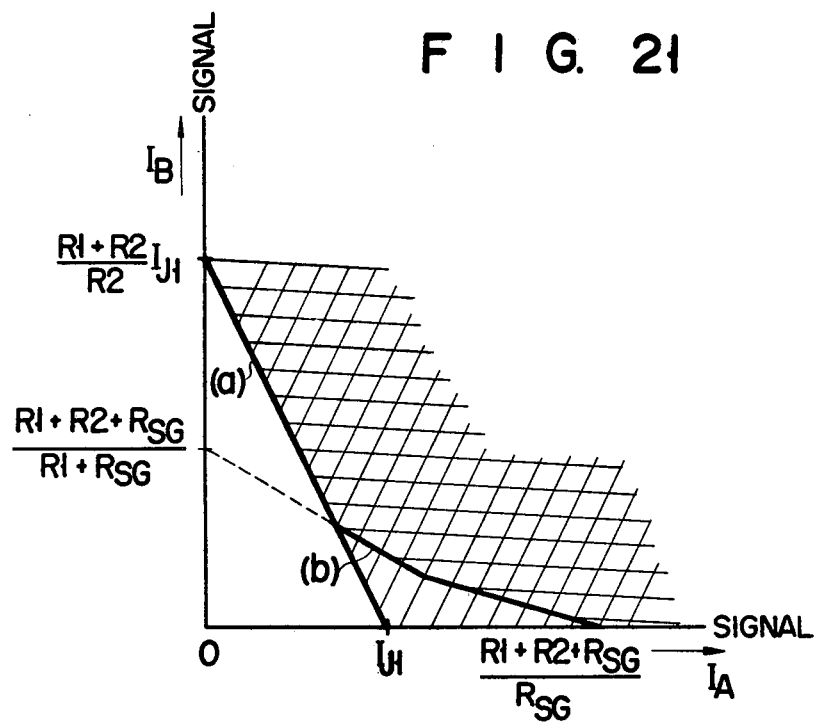
F I G. 22
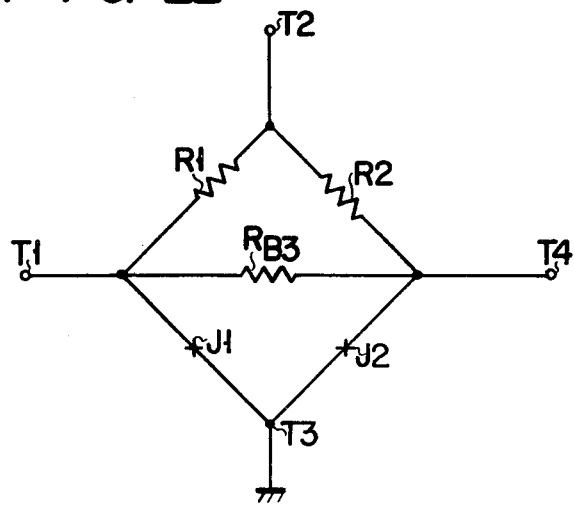

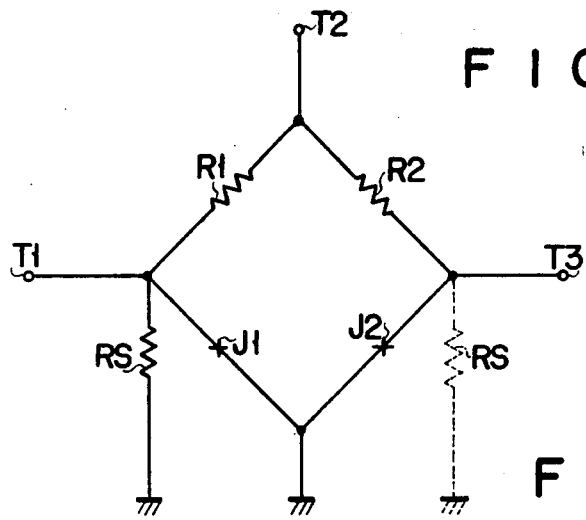
FIG. 23
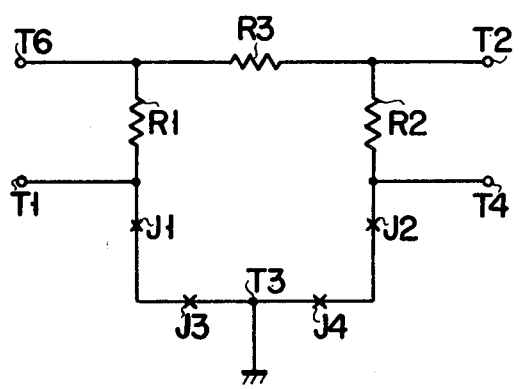
FIG. 24
FIG. 25
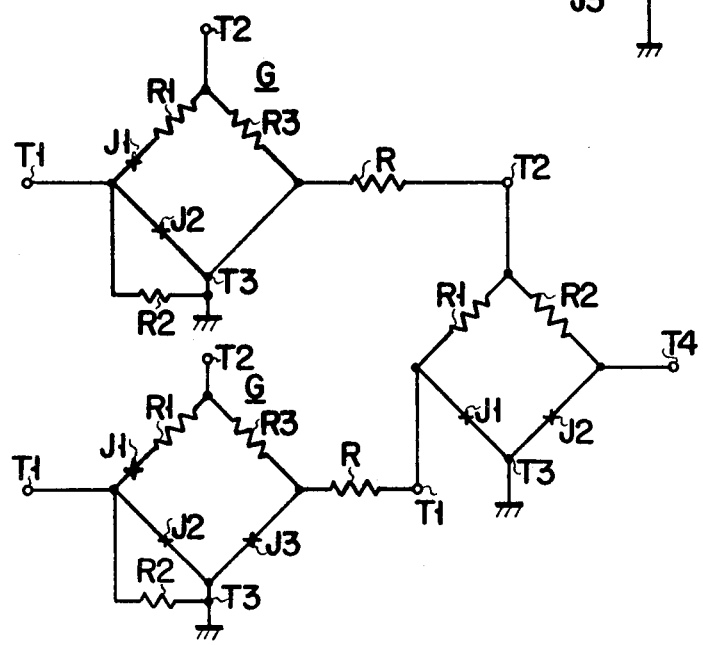

F I G. 26
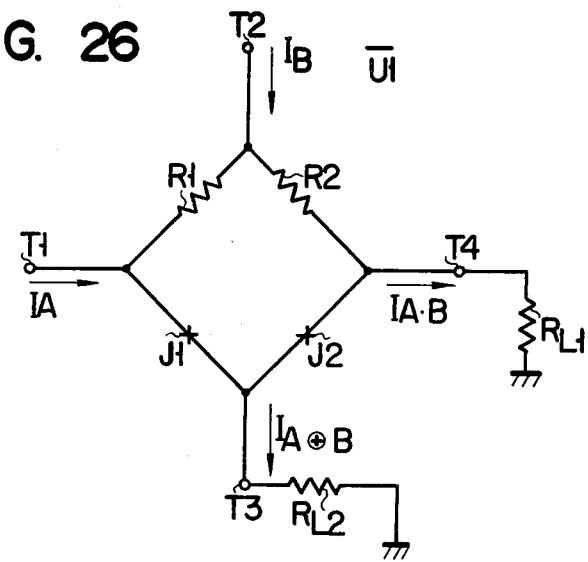
F I G. 27
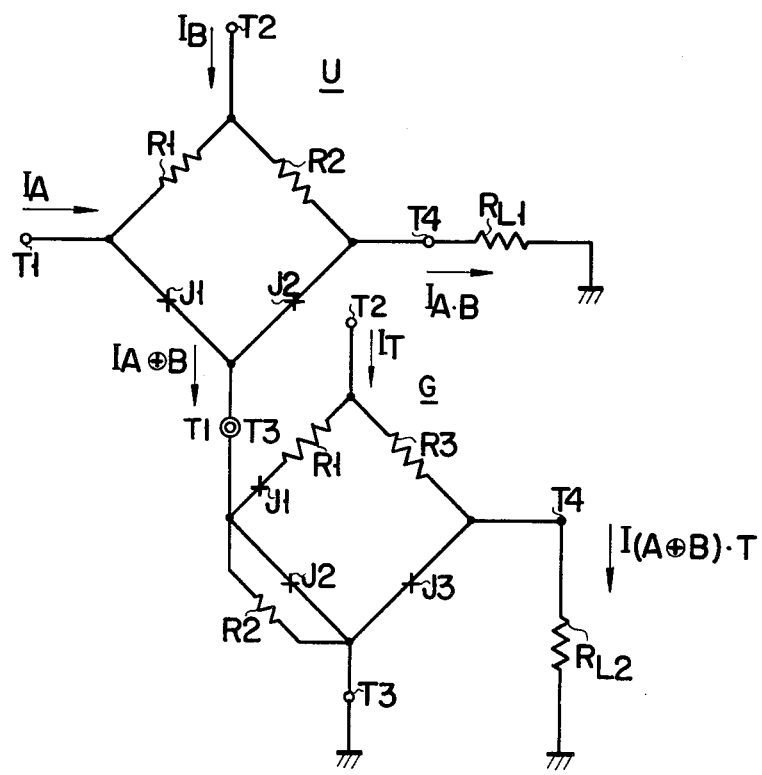

F I G. 30
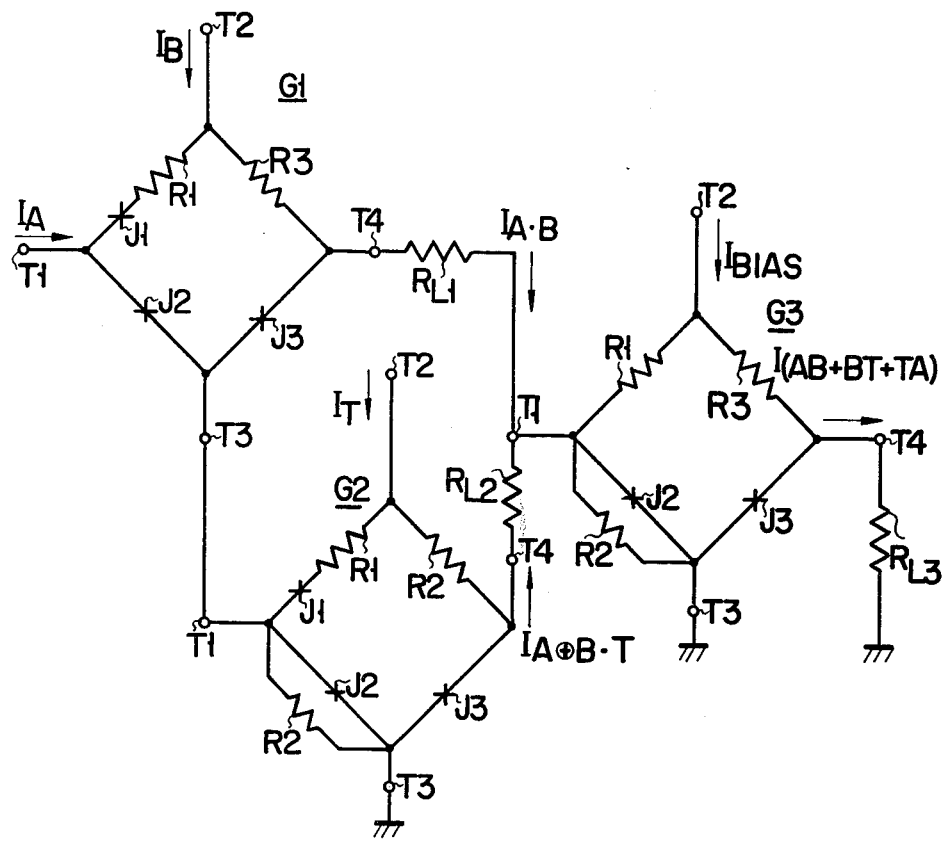

SUPERCONDUCTIVE LOGIC CIRCUIT

BACKGROUND OF THE INVENTION

The present invention relates to a superconductive logic circuit of current coupling type which does not involve a magnetic flux quantum interferometer and, more particularly, to a superconductive logic circuit comprised of Josephson junctions, which may be used to constitute various kinds of logic circuits, which has a high current gain and which has a wide operation margin.

Conventional superconductive logic circuits are roughly classified by the input system into the magnetic coupling type and the current injection type. In a superconductive logic circuit of magnetic coupling type, an input signal is magnetically coupled to a loop including a Josephson junction and inductance, and logic operations are performed by transformation of the Josephson junction to the non-zero voltage state as shown in U.S. Pat. No. 3,978,351. In this example, the Josephson junction and the inductance constitute a magnetic flux quantum interferometer, and the product L.IJ of the inductance L and the critical current IJ of the Josephson junction is selected to be close to one magnetic flux quantum $\phi 0$. Therefore, when the critical current IJ is made small for energy consumption, a large inductance L is required, making it difficult to realize a compact circuit and reducing the operating speed. Conversely, when the inductance L is made smaller for obtaining a higher operating speed, the value of the critical current IJ becomes greater and energy consumption increases. Further, the circuit is subject to the influence of external magnetic noise, stray inductance and so on, resulting in extreme fluctuations and unstable operation. Such a circuit is also defective in that uniform and efficient connection of a number of input wires is difficult structurally.

A superconductive logic circuit of current injection type has been proposed as an improvement over such a circuit, which does not involve a magnetic flux quantum interferometer. In a superconductive logic circuit of current injection type, current is directly supplied to the Josephson junction for switching into the non-zero voltage state in order to perform logic operations. A prior art superconducting logic circuit of the current injection type which does not involve a magnetic flux quantum interferometer is shown in IEDM "Josephson Direct Coupled Logic (DCL)" (1492, 12), IBM. According to this example, the defects of the superconductive logic circuit of the magnetic coupling type which involve magnetic flux quantum interferometer are solved. However, the threshold for determining the sensitivity is solely determined by the switching of the non-zero voltage state of a single Josephson junction so that only a current gain of at most 1 may be obtained. Therefore, although it is advantageous to use it as a switch, it is difficult to apply it to various kinds of logic circuits.

The object of the present invention is to provide a superconductive logic circuit which eliminates the defects of the prior art circuits, which has a high sensitivity, therefore, a high gain and a wide operation margin, and which is advantageous for assembly into various kinds of logic circuits.

SUMMARY OF THE INVENTION

In order to achieve the above and other objects, the present invention provides a superconductive logic circuit comprising a basic logic gate, said basic logic gate including first and second input terminals connected at least at two nodes of a bridge circuit having four branches; an output terminal connected at least at one node of said bridge circuit; a series circuit which includes of a first resistor and a first Josephson junction connected between said first and second input terminals to comprise the first branch of said bridge circuit; a parallel circuit which includes a second resistor and a second Josephson junction connected between said first input terminal and a grounding terminal of said bridge circuit to comprise the second branch; a third resistor connected between said second input terminal and one of said nodes of said bridge circuit to comprise the third branch of said bridge circuit; and a third Josephson junction connected between said node with the third resistor and said grounding terminal to comprise the fourth branch of said bridge circuit.

With such a construction, the circuit does not constitute a magnetic flux quantum interferometer so that it may be capable of highly stable operation and high integration and it may have the advantages obtainable with a circuit of the current injection type, such as low power consumption and high speed operation. It may have a large current gain, may have a wide operation margin, and may be easily applied to various logic circuits such as AND, OR, INVERT, Exclusive OR, and majority OR circuits.

This invention can be more fully understood from the following detailed description when taken in conjunction with the accompanying drawings.

BRIEF DESCRIPTION OF THE DRAWINGS

FIG. 13 is a circuit diagram showing still another embodiment based on the basic gate of FIG. 11;

FIG. 14 is a circuit diagram showing still another embodiment based on the basic gate of FIG. 11;

FIG. 17 is a circuit diagram showing an embodiment wherein to the circuit of FIG. 16 is further connected another logic gate as a current amplification stage;

FIG. 18 shows an embodiment of the circuit configuration shown in FIG. 16 wherein an inductance is connected between the output terminal and the input terminal of the basic logic gates;

FIG. 21 is a graph showing the threshold value curves for determining the operation margin of the basic logic gate of FIG. 20;

FIG. 22 is a circuit diagram showing another modification of the gate of FIG. 20;

FIG. 23 is a circuit diagram showing still another modification of the gate of FIG. 20;

FIG. 24 is a circuit diagram showing still another modification of the gate of FIG. 20;

FIG. 25 is a circuit diagram showing an embodiment wherein the basic logic gate of FIG. 1 is connected to the first and second input terminals of the gate of FIG. 20;

FIG. 26 is a circuit diagram showing the case wherein the circuit configuration of FIG. 20 is used as a logic gate for realizing other logic functions;

FIG. 27 is a circuit diagram showing the case wherein the basic logic gates of FIGS. 1 and 20 are connected for realizing other logic functions;

FIG. 30 is a circuit diagram of a logic gate which connects the basic logic gate of FIG. 1 and a plurality of the modified logic gates for realizing other logic functions.

DETAILED DESCRIPTION

Figure 1:
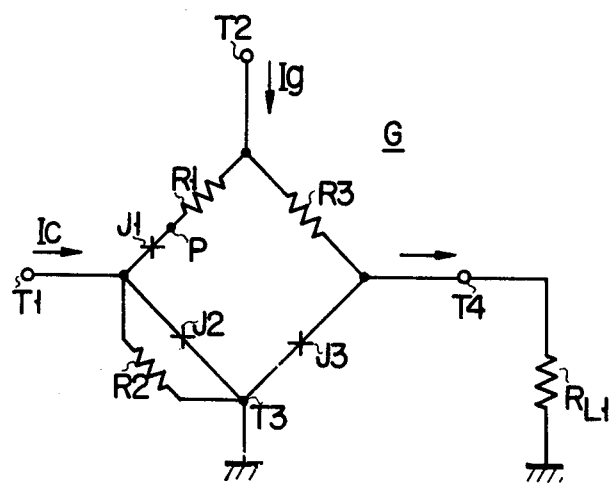
FIG. 1 is a circuit diagram of a basic logic gate according to an embodiment of the present invention.
Figure 2:
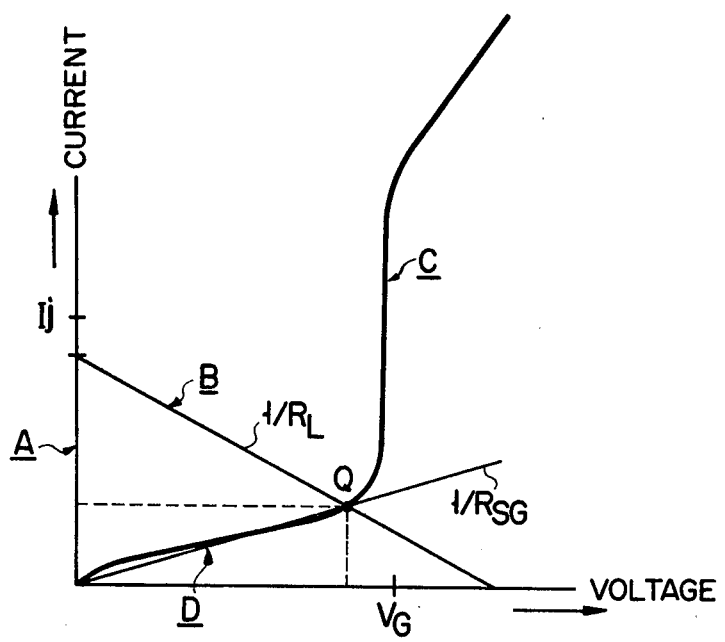
FIG. 2 is a graph showing the voltage-current characteristics of a Josephson junction.

The present invention will now be described by way of its examples with reference to the accompanying drawings. FIG. 1 shows a bridge circuit basic to a superconductive logic circuit of the present invention wherein a series circuit of a first resistor R1 and a first Josephson junction J1 is connected between a first input terminal T1 and a second input terminal T2, thus constituting a first branch of the bridge circuit. A parallel circuit consisting of a second resistor R2 and a second Josephson junction J2 is connected between the first input terminal T1 and a grounding terminal T3 to constitute a second branch of the bridge circuit. A third resistor R3 is connected between the second input terminal T2 and an output terminal T4 to constitute a third branch of the bridge circuit. A third Josephson junction J3 is connected between the output terminal T4 and the grounding terminal T3 to constitute a fourth branch of the bridge circuit. A load resistor RL1 is connected to the output terminal T4 to constitute a basic logic gate G. The voltage-current characteristics of each of the first, second, and third Josephson junctions shown in FIG. 1 may be as shown in FIG. 2. When the value of a critical current which flows into the Josephson junction is less than IJ, the Josephson junction is seen to be superconductive state A wherein the resistance is zero and no voltage is induced across it. When a current exceeding IJ flows into the Josephson junction, the operation point moves along a load curve B and to an intersection Q with a voltage-current characteristic curve C, and the Josephson junction ceases to be superconductive state. At the intersection Q, the Josephson junction has a resistance which depends on the value of the load resistor RL1, and a voltage close to a voltage VG is induced across the resistor RL1. Under this condition, the Josephson junction is said to be switched to a non-zero voltage state. When the load resistance RL1 is small, the intersection Q which is the operation point moves to a subgap region D shown in FIG. 2 and the resistance of the Josephson junction (resistance of the subgap) becomes RSG. The circuit according to the embodiment of the present invention shown in FIG. 1 and which comprises a bridge circuit including Josephson junctions having the voltage-current characteristics described above operates in the manner to be described below. First, a bias current Ig is supplied to the second input terminal T2. This bias current Ig is delivered into two paths according to the resistance ratio of the resistors R1 and R3; the current flows to ground partly through the first and second Josephson junctions J1 and J2 and partly through the third Josephson junction J3. The bias current Ig must be of such a level that cannot switch any Josephson junction into the non-zero voltage state without additional current feeding. Subsequently, an input current Ic is fed to the first input terminal T1. A fraction of the bias current Ig and the total input current Ic flow through the second Josephson junction J2 and switch it into the non-zero voltage state.

The threshold condition for switching the J2 is given by the following equation:

$$\frac{R3}{R1 + R3} Ig + Ic > IJ2 \quad (1)$$

where IJ2 is the critical current of Josephson junction J2. As a result, the Josephson junction J2 comes to have a high resistance, and a fraction of the input current Ic which has been flowing before the switching of Josephson junction J2 takes the value $(R2/(R1+R2+R3)) \cdot Ic$ and flows to ground through the series circuit of the first Josephson junction J1 and the resistor R1, the third resistor R3 and the third Josephson junction J3.

Further, since the Josephson junction J2 has a high resistance, the fraction of the bias current Ig which flows to the resistor R1 and the Josephson junction J1 decreases, and the divided current which flows to the resistor R3 and the Josephson junction J3 increases. As a result, since the current flowing through the third Josephson junction J3 increases, the third Josephson junction J3 is transformed to the non-zero voltage state and has a high resistance. The threshold condition for the J3 switching is given by the following equation:

$$\frac{R2'}{R1+R2'+R3} Ic + \frac{R1+R2'}{R1+R2'+R3} Ig > IJ3 \quad (2)$$

where IJ3 is the critical current of the Josephson junction J3, and R2' is the parallel resistance of the Josephson junction J2 and the resistor R2. The value of the resistor R2 holds the relation R2<<RSi where RSi is the resistance of the Josephson junction J3 at the operation point Q. When the resistances of the resistors R1, R2 and R3 are smaller than RS1, RS2 and RS3 of the resistances of the Josephson junctions J1, J2, and J3 at the respective operation points and when the value of the bias current Ig is greater than the value of the critical current IJ1 flowing through the Josephson junction J1, that is, Ig>IJ1 ... (3), most of the input current Ic flows to ground through the resistor R2. Under this condition, the bias current Ig flows to ground through the series circuit of the resistor R1 and the Josephson junction J1 and the resistor R2. Therefore, the current which flows through the Josephson junction J1 increases so that the Josephson junction J1 is transformed to the non-zero voltage state and has a high resistance.

Finally, the bias current Ig is obtained as the output current at the load resistor RL1 or the output terminal T4. Under this condition, since the Josephson junction J3 has a high resistance, the first input terminal T1 and the output terminal T4 are separated electrically, making the complete separation of the input and output signals at this gate. Therefore, erroneous operation of the load connected to the output terminal T4 may be prevented.

The operation threshold curve of the circuit configuration of FIG. 1 will be described with reference to FIG. 3.

Figure 3:
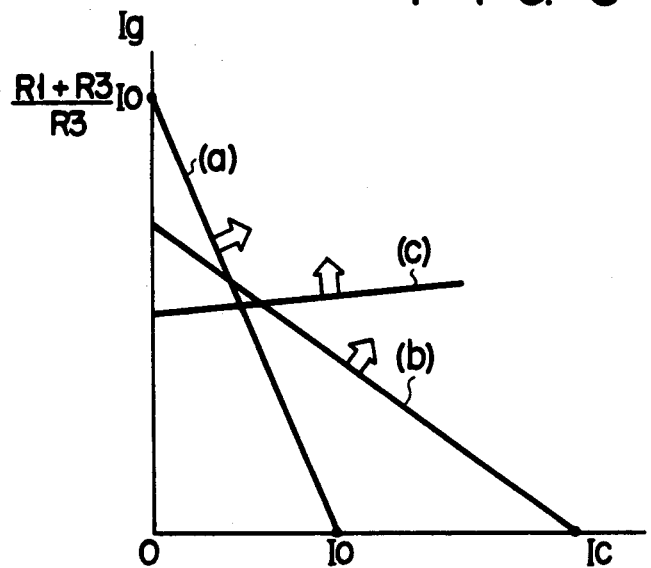
FIG. 3 is a graph showing the threshold value curves for determining the operation margin of the basic logic gate according to the embodiment of the present invention of FIG. 1.

The threshold value of the Josephson junction J2 for transformation to the non-zero voltage state may be shown by curve (a) in FIG. 3 according to said equation (1). The current gain provides a reference for determining the sensitivity of the gate in performing the switching operation in response to a small input current for obtaining a larger output current. This current gain may approximately be given, with a general gate, by the gradient of the threshold curve at a relatively high bias signal level. When obtaining the current gain from the threshold curve (a) in FIG. 3, the current gain becomes (R1+R3)/R3 times the input current Ic. Thus, the current gain is always larger than 1 and its value is determined only by the ratio of the resistances. When the resistances of the resistors R1 and R3 are equal, a current gain of 2 can be obtained. A higher current gain may be obtained by adopting a greater ratio of R1/R3.

The threshold value of the Josephson junction J3 for transformation to the non-zero voltage state may be expressed as $$Ig > \frac{R1+R2'+R3}{R1+R2'} \cdot IJ3$$

from equation (2) when the input current Ic=0, and the threshold value curve may be represented by (b) in FIG. 3. The threshold value curve of the Josephson junction J1 for switching to the non-zero voltage state may be represented by (c) in FIG. 3. Therefore, the common region A defined by the threshold curves represented by (a), (b) and (c) determines the region which allows the operation current margin. The operation margin may be varied by moving the threshold curves (a), (b) and (c) by arbitrarily setting the resistances of the resistors used in the basic gate; thus the operation margin is not limited to the region shown in FIG. 3.

The operation margin for providing a high current gain is determined by the relative positions of the threshold curves (a), (b) and (c) determined by the selected resistances and the critical value of the bias current. A current gain of 3 may be obtained when the position of the intersection of the threshold curve (a) and the threshold curve (b) is more than 50% of the critical value of the bias current Ig if, for example, R1=2R3, R1J1=IJ3, and R1,R3<<R2<<RL<<RJ2.

With a high sensitivity, switching of this logic gate is possible with a small input current Ic, allowing a larger parallel fan-out. A fan-out of more than 3 may be obtained under the condition described above while maintaining a wide operation margin. With this gate, the critical amplitude of the input current is not limited. This indicates that the circuit will operate normally even when a plurality of input currents are simultaneously fed to the input terminal T1 in the dotted in form. With this gate, a great fan-in may be obtained in this instance. More specifically, the first input terminal T1 shown in FIG. 1 may be replaced by three input terminals TA1, TA2 and TA3 (not shown). In this case, the data can be switched only if an input is supplied to any one of the three input terminals. Suppose input signal IA1, IA2 and IA3 are supplied respectively to the input terminals TA1, TA2 and TA3. Then, the output terminal T4 delivers a logic sum of these input signals, i.e. IA1+IA2+IA3. Further, if the bias signal Ig is supplied to the circuit in addition to the input signals IA1, IA2 and IA3, the output terminal T4 delivers a logic product of Ig and IA1+IA2+IA3, i.e. Ig(IA1+IA2+IA3).

The operating speed of this logic gate is solely dependent upon the capacitance of the Josephson junction. Thus, since propagation delay introduced by inductance is not included and a parallel fan-out is possible, the operating speed becomes high. Since the bridge of the logic gate does not include an inductance, the gate may advantageously be made compact in size.

Figure 4:
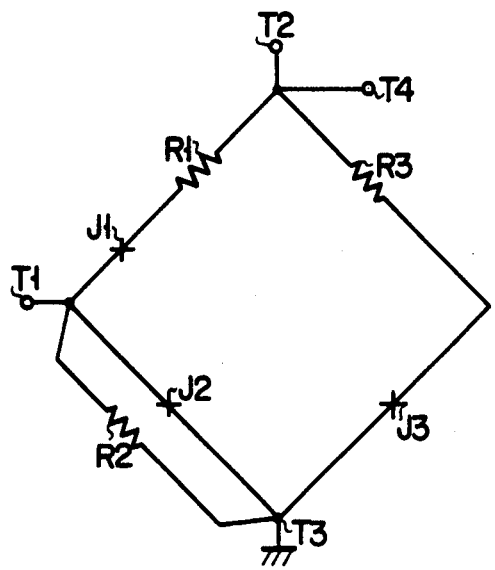
FIG. 4 is a circuit diagram showing a modification of the circuit of FIG. 1.

Although the output terminal T4 is connected to the node of the resistor R3 and the Josephson junction J3 in the embodiment shown in FIG. 1, the output terminal T4 may be set at the same position as the first input terminal T1 in FIG. 1, as shown in FIG. 4. Although it will not be described, the circuit of this embodiment operates in the same manner as described with reference to the embodiment in FIG. 1 and, therefore, similar advantages may be obtained with this embodiment. In these embodiments, the output terminal T4 may be connected to the node P.

Figure 5:
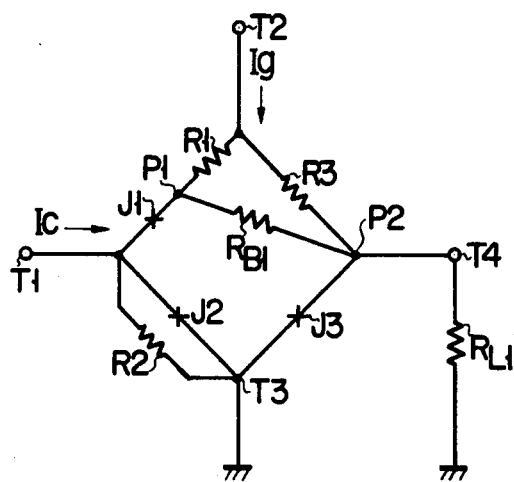
FIG. 5 is a circuit diagram showing another embodiment of the present invention.

Another embodiment of the present invention will now be described referring to FIG. 5. Referring to FIG. 5, the circuit configuration is the same as that shown in FIG. 1 except that a bypass resistor RB1 is connected between a node P1 of the first Josephson junction J1 and the first resistor R1, constituting the first branch of the bridge circuit of FIG. 1, and a second node P2 of the third resistor R3 and the third Josephson junction J3, to which the output terminal T4 is connected.

The resistance of the bypass resistor RB1 is set to be sufficiently smaller than the resistances of the resistors R1, R2, and R3. The resistance of the second resistor R2 must be set to be smaller than the resistance of the load resistor RL1. However, the absolute resistance values of the first resistor R1 and the third resistor R3 may be arbitrarily selected if the ratio of the respective resistances is correctly set.

The mode of operation of the circuit of the configuration shown in FIG. 5 will now be described.

The input current Ic and the input current Ig are simultaneously supplied to the bridge circuit from the first input terminal T1 and the second input terminal T2, respectively. Thus, the fractional current of the input current Ic and the input current Ig determined by the ratio of resistors R1 and R3 flows through the Josephson junction J2 which is then switched to the non-zero voltage state and has a high resistance. The equation to be satisfied for transforming the second Josephson junction to the non-zero voltage state is the same as equation (1) given with reference to FIG. 1. When the second Josephson junction J2 is switched to the non-zero voltage state and has a high resistance, most of the input current Ic flows to the third Josephson junction J3 through the bypass resistor RB1 and remaining part of the input current Ic flows to the third Josephson junction J3 through the first Josephson junction J1, the resistor R1 and the resistor R3. Simultaneously, most of the input current Ig flows to the third Josephson junction J3 through the resistor R3 and another part thereof flows to the third Josephson junction J3 through the bypass resistor RB1. As a result, the third Josephson junction J3 is switched to the non-zero voltage state. In this instance, the divided input current which flows through the third Josephson junction J3 after the switching of the second Josephson junction J2 to the non-zero voltage state increases by the part flowing through the bypass resistor RB1. Therefore, the third Josephson junction J3 may easily be switched to the non-zero voltage state with small values of the input currents Ic and Ig.

The equation to be satisfied for switching the third Josephson junction J3 to the non-zero voltage state may be expressed by equation (3) below:

$$(b + a + ab + bc)Ig + b(1 + a + c)Ic \geq [b(1 + a + c) + a + c]I_{J3} \quad (3)$$

where $a = R1/RB1$, $b = R2'/RB1$ and $c = R3/RB1$, and $R2'$ is the parallel resistance of the resistance of the second Josephson junction J2 after the voltage switching and the resistance of the resistor R2. Since the relation $RB1 << Ri$ ($i = 1$ to 3) may hold, the above relation may be approximated by:

$$Ig + Ic \geq I_{J3}$$

When the third Josephson junction J3 is switched to the non-zero voltage state and has a high resistance, most of the input current Ig flows to ground through the second resistor R2 and the series circuit of the first resistor R1 and the first Josephson junction J1. Consequently, the first Josephson junction J1 is also switched to the non-zero voltage state to have a high resistance.

The equation to be satisfied for switching the first Josephson junction J1 may be expressed by equation (4) below:

$$\left(\frac{RL'}{RB1} + \frac{c}{1+a+c}\right) Ig - bIc \geq \quad (4)$$

-continued $$\left(1 - \frac{1}{1+a+c} + b + \frac{RL'}{R4}\right) \frac{c}{a} I_{j1}$$

where $(c/a)I_{j1} = I_{j2} = I_{j3}$, and $RL'$ is the parallel resistance of the resistance of the load resistor RL and the resistance of the third Josephson junction J3 after the switching to the non-zero voltage state. If $RL >> R2 >> RB1$, this relation may be approximated by:

$$Ig < I_{J1}$$

The switching operation is completed according to the sequence described above and the input current Ig is supplied to the load from the output terminal T4. In the embodiment shown in FIG. 5, the bypass resistor RB1 is connected between the nodes P1 and P2. Therefore, even if there is a leakage current which flows to ground after the switching of the second Josephson junction J2 to the non-zero voltage state, a current sufficient for effecting the switching of the third Josephson junction J3 may be obtained with small values of the input currents Ig and Ic without narrowing the operation margin.

Further, according to this embodiment, when the resistances of the first resistor R1 and the third resistor R3 are such that they may be set with high precision and the resistance of the resistor RB1 is set to be small, the divided current flowing to the third Josephson junction J3 after the switching of the second Josephson junction J2 to the non-zero voltage state may be increased so that the third Josephson junction J3 may be switched to the non-zero voltage state with small values of the input currents Ic and Ig. Therefore, even when the resistance after the switching of the Josephson junction to the non-zero voltage state cannot be made sufficiently small or when the resistors R1, R2, and R3 include manufacturing errors due to pattern conversion errors or contact resistance depending upon the manufacturing conditions, an output of high current gain may be obtained without influencing the threshold curve (a) shown in FIG. 3. The operation margin may also be increased by reducing the values of the input currents Ic and Ig, thus allowing a high speed operation.

Figure 6:
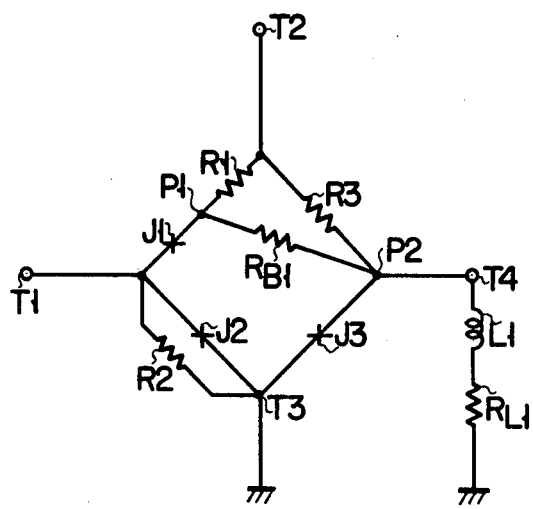
FIG. 6 is a circuit diagram showing another embodiment of the circuit of FIG. 5.

In the embodiment shown in FIG. 5, the load resistor RL1 is connected between the output terminal T4 and ground. However, as shown in FIG. 6, a series circuit of the load resistor RL1 and an inductance L1 may alternatively be connected between the output terminal T4 and ground. In a Josephson junction, a transient current of large amplitude and sharp leading edge flows upon the transformation to the non-zero voltage state. The transient current of frequency f0 generated upon the switching of the third Josephson junction J3 to the non-zero voltage state encounters resistance in flowing to ground due to the inductance L1 acting as a resistance of frequency $2\pi f0L$ close to the value of the load resistor RL1. Therefore, most of the transient current flows to the first Josephson junction J1. It follows from this that the level of the bias current Ig required for the switching of the first Josephson junction to the non-zero voltage state may be low. This embodiment is advantageous in that the normal operation range, and therefore the operation margin, may be secured wide by lowering the threshold value of the bias current Ig. When the resistance of the load resistor RL1 is 5 Ω, the value of the inductance L1 is about 1 pH. Thus, these inductances may be on the order of the stray inductance, allowing a sufficiently small circuit. Further, since these inductances do not influence the major thresholds which in turn influence the current gain, these inductances need not be precise.

Figure 7:
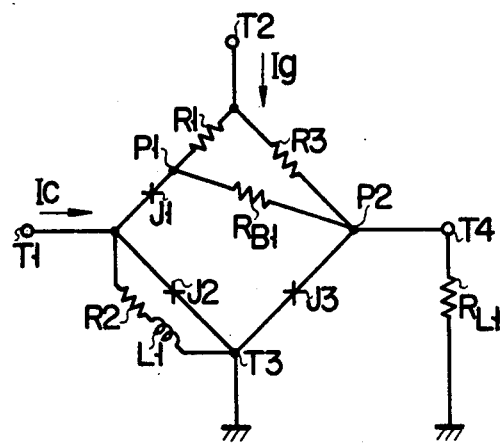
FIG. 7 is a circuit diagram showing still another embodiment of the circuit of FIG. 5.

The resistor R2 connected in parallel with the second Josephson junction J2 may alternatively be a series circuit of the resistor R2 and an inductance L2 as shown in FIG. 7. In this case, the transient current generated upon the switching of the second Josephson junction J2 to the non-zero voltage state functions such that the inductance L2 acts as a resistance so as to make the series circuit with the resistor R2 have a high resistance. For this reason, almost all of the input current Ic flows to the third Josephson junction J3 together with the bias current Ig. Since the input currents Ic and Ig effectively flow to the third Josephson junction J3, a wide operation margin may be obtained because Josephson junction J3 switches to the non-zero voltage state by the small input current. This inductance may also be of the order of a stray inductance as in the case of the inductance L1 described above and need not be precise.

Throughout the description of the embodiments shown in FIGS. 5, 6 and 7, the same reference numerals denote the same parts and the description of the circuit configuration is omitted.

Figure 8:
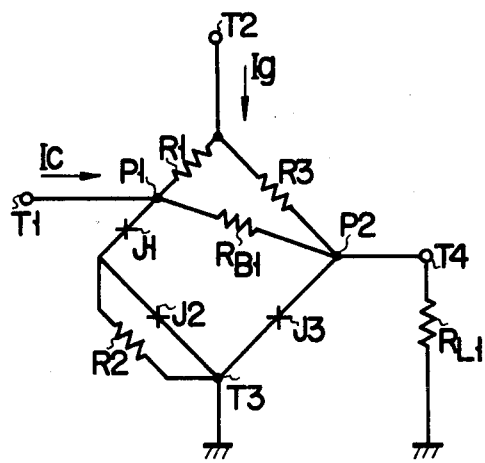
FIG. 8 is a view showing another modification of the circuit of FIG. 5.

FIG. 8 shows another embodiment of the present invention which is the same as that shown in FIG. 5 except that the first input terminal T1 is connected to the node of the first Josephson junction J1 and the first resistor R1. The operating sequence of this embodiment may be as follows. When the input current Ic is supplied to the first input terminal T1 and the input current Ig is supplied to the second input terminal T2, the first Josephson junction J1 is supplied with the total input current Ic and the fraction of the input current Ig divided by the resistors R1 and R3 and is thus switched to the non-zero voltage state. Since the first Josephson junction J1 then has a great resistance, both the input currents Ic and Ig flow to the third Josephson junction J3 to switch the junction to the non-zero voltage state. As a result, the third Josephson junction J3 is placed under the condition to act as a resistance, and the first input current Ic and the second input current Ig are obtained from the output terminal T4 as an output current through the load resistor RL1. Therefore, this embodiment is advantageous in that it allows a wide operation margin and a large output current.

In the circuit of FIG. 8, node P is used as an input terminal. Similarly, node P1 may be used as an input terminal also in the circuits of FIGS. 1, 4, 6 and 7. If node P is so used in these circuits, similar effects will be obtained as in the circuits of FIGS. 1, 4, 6 and 7.

Various logic gates may be realized based on the basic gate examples described above.

When a gate including a resistor or a Josephson junction is inserted instead of directly grounding the third terminal in FIG. 1, a gate for providing a plurality of outputs may be realized.

An embodiment of a logic gate having AND and OR functions based on the circuit configuration shown in FIG. 1 will be described referring to FIG. 9. The logic gate of this embodiment is of the same configuration as that of FIG. 1 except that a node between the third Josephson junction J3 and one end of a parallel circuit of the second Josephson junction J2 and the second resistor R2 is connected to the output terminal T3, a load resistor RL2 is connected between the output terminal T3 and ground, and the description thereof will be omitted. Load resistors RL1 and RL2 may be considered as impedances between the output terminals T4 and T3 and ground.

It is assumed that an input current IA is supplied to only the first input terminal T1 under the condition that the resistors R1, R2, R3 and RL2 $<<$ RL1 and I1 $<$ IJ1+IJ3 (where IJ1 and IJ3 stand for the critical superconductive currents of the Josephson junctions J1 and J3). The input current IA is divided; one branch is output from the output terminal T3 through the first Josephson junction J1, the first resistor R1, the third resistor R3, and the third Josephson junction J3 in the order named, and the other branch is output from the output terminal T3 through the second Josephson junction J2 or the resistor R2. In this case, the third Josephson junction J3 is not switched to the non-zero voltage state.

It is now assumed that an input current IB is supplied to the second input terminal T2 alone under the condition IJ1 $<$ IB $<$ IJ1+IJ3. The input current IB is devided by the resistors R1 and R3 and is obtained from the output terminal T3 without switching the Josephson junction J1, J2 or J3 to the non-zero voltage state.

In summary, when the input current is supplied to either the first input terminal T1 or the second input terminal T2 alone, an output of $I_{A+B}$ is always obtained from the output terminal T3. Thus, it is seen that this logic gate functions as an OR circuit.

A case will now be considered wherein the input signal IA is supplied to the first input terminal T1 and the input signal IB is supplied to the second input terminal T2 simultaneously.

Since the first input current IA and part of the second input current IB divided by the resistors R1 and R3 flow through the second Josephson junction J2, the second Josephson junction J2 is switched to the non-zero voltage state to have a high resistance. Thus a small fraction of the first input current IA and a large fraction of the second input current IB flow to the third Josephson junction J3 through the resistor R3 so that it is transformed to the non-zero voltage state to have a high resistance. Thus, the first input signal IA flows through the resistor R2 to the output terminal T3. The large fraction of the second input current IB flows to the first Josephson junction J1 through the resistor R1 and then to the output terminal T3 through the resistor R2. As a result, the first Josephson junction J1 is switched to the non-zero voltage state to have a high resistance. Finally, the second input current is obtained from the output terminal T4. The output $I_{A \cdot B}$ obtained from the output terminal T4 is obtained when both the first input terminal T1 and the second input terminal T2 are supplied with inputs. Thus, this logic gate is seen to operate as an AND circuit as well.

Figure 9:
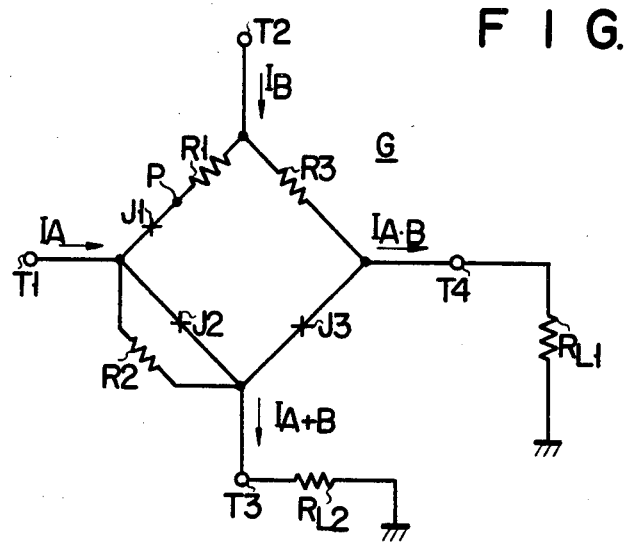
FIG. 9 is a circuit diagram showing the case wherein the circuit of the construction shown in FIG. 1 is used as a logic gate for realizing other logic functions.
Figure 10:
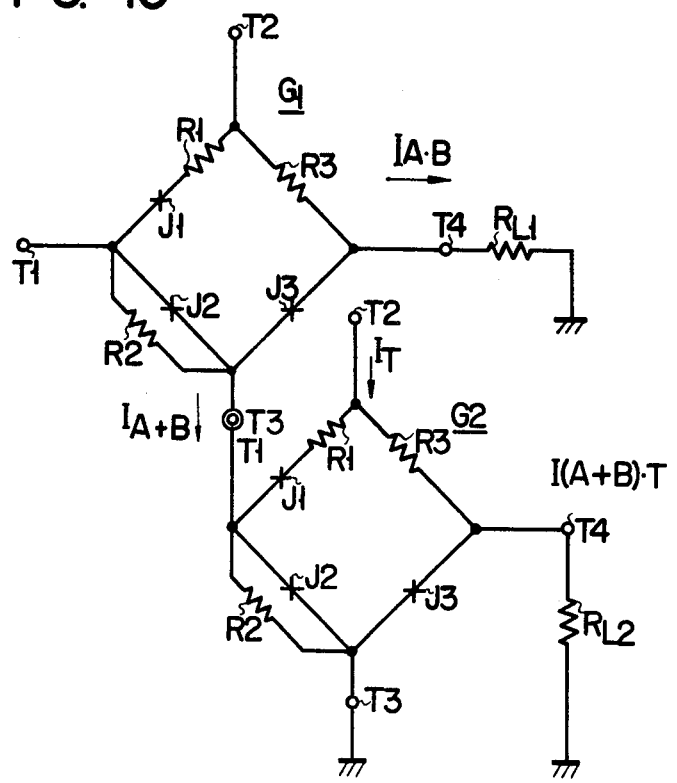
FIG. 10 is a circuit diagram showing the case of another logic circuit based on the basic gate of FIG. 9.

FIG. 10 shows the circuit configuration of a logic gate based on the principle as in FIG. 9 according to another embodiment of the present invention wherein the output terminal T3 of the circuit shown in FIG. 9 is connected, instead of to the load resistor RL2, to the first input terminal T1 of a second basic gate. The basic operation of this logic gate is the combination of the individual basic gates shown in FIGS. 1 and 9. Therefore, the detailed description will be omitted.

According to this embodiment, an AND output $I_{A \cdot B}$ of a first input current IA and a second input current IB is obtained from the output terminal T4 of the first basic gate, and an OR output $I_{A+B}$ of the first input current IA and the second input current IB is obtained from the output terminal T3. When the OR output $I_{A+B}$ is input to the first input terminal T1 of the second basic gate and an input current IT is supplied to the second input terminal T2 of the second basic gate, an AND output $I_{(A+B) \cdot T}$ is obtained from the output terminal T4.

An embodiment of a logic gate which realizes exclusive OR and inverter functions based on the basic gate shown in FIG. 1 will now be described.

Figure 11:
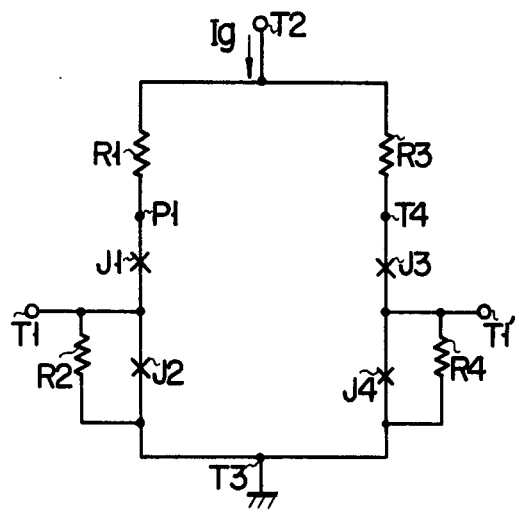
FIG. 11 is a circuit diagram for realizing other logic functions according to still another embodiment of the present invention.

FIG. 11 shows a circuit configuration according to which a parallel circuit consisting of a fourth Josephson junction J4 and a fourth resistor R4 is connected between the third Josephson junction J3 and the node which is connected to the grounding terminal T3 of the basic gate shown in FIG. 1. The resistance of the resistor R4 is assumed to be substantially the same as that of the resistor R2. Another symmetrical input terminal T1' is connected to a node of one end of this parallel circuit and the third Josephson junction J3. The exclusive OR operation may be described as follows. When the first input current IA alone is supplied to the first input terminal T1 or when the input current is supplied to the other input terminal T1' alone, an OR output is obtained at the output terminal T4, P1, or T2 upon supplying the second bias current Ig at the second terminal T2.

The Josephson junctions J1 to J4 are switched in the same order as in the circuit of FIG. 1.

It is now assumed that input currents IA and IA' are simultaneously supplied to the input terminal T1 and the other input terminal T1'. In this case, even when the second Josephson junction J2 is switched to the non-zero voltage state by the input current IA and the fourth Josephson junction J4 is switched to the non-zero voltage state by the input current IA', currents flowing through the first and third Josephson junctions J1 and J3 cancel each other since the input currents IA and IA' flow in opposite direction. Thus, these input currents IA and IA' flow to ground through the resistors R2 and R4 so as not to switch these Josephson junctions to the non-zero voltage state. Even when the bias current Ig is supplied to the second input terminal T2 under this condition, this bias current Ig is divided by the resistors R1 and R3 so that the first and third Josephson junctions J1 and J3 may not be switched to the non-zero voltage state. Therefore, neither of the input currents IA and IA' may be obtained as an output from the terminal T4, P1 or T2. Thus, no output may be obtained at the output terminal, to which a load is connected, even if input signals are simultaneously supplied to both input terminal T1 and T1'. The same may happen when currents are not supplied simultaneously.

Obviously, the exclusive OR current supplied to the terminal T1 or T1' alone is delivered from the terminal T4, P1 or T2 thus performing exclusive OR function. In the circuit of FIG. 11 at least two input currents may be supplied to the terminal T1 or T1', and the circuit functions as a wired OR gate.

A case will now be described wherein the circuit configuration shown in FIG. 11 is used to realize an INVERTER.

It is now assumed that a signal to be inverted is input to the terminal T1' with a certain timing. It is also assumed here that a constant current flows through the terminal T1 and the bias current supplied to the terminal T2 is always supplied at a timing delayed relative to the timing of the input current. When there is no current input at the timing at which the input current must be supplied; that is, when a current input of 0 is present, the operation is explained as follows. The bias current Ig is supplied to the second input terminal T2 while the first input signal IA is being continuously supplied to the first input terminal T1. In this case, the second Josephson junction J2, the third Josephson junction J3, and the first Josephson junction J1 are switched to the non-zero voltage state in the order named, and an output is obtained from one of the output terminals T4, P1 and T2. On the other hand, a case will be considered wherein there is no signal to be inverted, that is, an input current of 0 is present in the system, the terminals T1 and T1' are interchanged, and a signal to be inverted is applied to the terminal T1 at a certain timing. An output may similarly be obtained when the input is continuously supplied from the other input terminal T1'.

On the other hand, when the input signal IA' to be inverted is supplied to the other input terminal T1' as the input signal IA is being continuously supplied to the input terminal T1, the currents flowing through the first Josephson junction J1 and the third Josephson junction J3 cancel each other so that the Josephson junctions J1 and J3 may not be switched to the non-zero voltage state. Under this condition, even when the bias current Ig is supplied to the second input terminal T2, neither the first Josephson junction J1 nor the third Josephson junction J3 can be switched to the non-zero voltage state. Therefore, no corresponding output may be obtained from any of the output terminals T4, P1, and T2. An inverted current may thus be obtained at the output terminal T4, P1, or T2 according to the presence or absence of the current supplied to the other input terminal T1' as the input current is being continuously supplied to the first input terminal T1.

Figure 12:
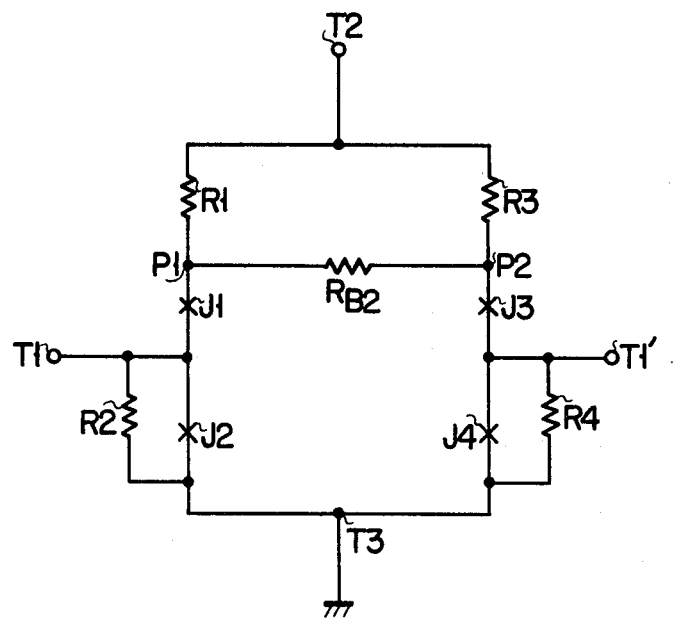
FIG. 12 is a view showing another modification of the circuit of FIG. 11.

FIG. 12 shows a circuit configuration which is the same as that shown in FIG. 11 except that a bypass resistor RB2 is connected between output terminals P1 and P2, and the description thereof will be omitted. The bypass resistor RB2 operates in the same manner as the resistor RB1 in FIG. 5, so the description thereof will be omitted. The bypass resistor RB2 increases the currents flowing through the third Josephson junction J3 and the fourth Josephson junction J4 for correctly performing the switching of these junctions to the non-zero voltage state. This implies that the threshold value of the input current may be lowered and the operation margin may be widened, facilitating the switching operation of the logic gate.

FIG. 13 shows an embodiment of a logic gate for realizing the majority OR function, which is of the same configuration as the circuit shown in FIG. 11 except that the circuit includes a bridge circuit comprising the resistor R3 of the third branch, the Josephson junction J3 of the fourth branch and the parallel circuit consisting of the Josephson junction J4 and the resistor R4, which is connected in parallel between the input terminal T2 and the grounding terminal T3. A fifth resistor R5 is connected between the input terminal T2 and an output terminal T5, and a fifth Josephson junction J5 and a parallel circuit of a sixth Josephson junction J6 and a sixth resistor R6 are connected in series between the output terminal T5 and the grounding terminal T3. A third input terminal T1" is connected to the node of the fifth Josephson junction J5 and the parallel circuit described above.

The above-described circuit is so set that the respective resistors, the bias current Ig fed to the input terminal T2, and bias current Ig1 divided by the respective resistors hold the relations of R1(=R3, =R5), $R2(=R4, =R6)<<RL$ (the resistance between the output terminal and ground); and RSG (the resistance of the Josephson junction after the switching to the non-zero voltage state) and $Ig>2Ig1$.

When the input current Ic is input to the respective input terminals T1, T1', and T1" under this condition, the second Josephson junction J2 is switched to the non-zero voltage state to have a high resistance if equation (5) below is satisfied:

$$\tfrac{1}{2}Ig + Ic > IJ2 \tag{5}$$

The second Josephson junction J2 is switched non-zero voltage state only when at least two of the input terminals T1, T1', and T1" are supplied with the input; it is not switched under any other input condition. Equation (6) below represents the conditions of this logic gate for not performing the switching operation with only one input current. Equation (7) below represents the conditions of this logic gate for performing the switching operation to obtain an output when two input currents are supplied.

$$\frac{R1 + R2}{1.5R1 + R2} Ig + \frac{R2}{1.5R1 + R2} Ic < 2IJ1 \tag{6}$$

$$\frac{R1 + R2}{1.5R1 + 0.5R2} Ig + \frac{R2}{3R1 + 2R2} Ic < 2IJ1 \tag{7}$$

As an example, when an input current IA is supplied to the input terminal T1, an input current IB is supplied to the input terminal T1', and an input current IC is supplied to the input terminal T1", a majority OR current IAIB+IBIC+ICIA is obtained as a majority OR output from an output terminal P1, T4, T5 or T2.

FIG. 14 shows still another embodiment of the present invention of a circuit configuration according to which the grounding terminal T3 of a first unit logic gate is connected to the input terminal T1 of a second unit logic gate, both of the same circuit configuration as FIG. 11. This circuit configuration realizes the exclusive OR function. The second unit logic gate is of the same circuit configuration as that of the first unit logic gate and the description thereof will be omitted. In this gate, the input current IA is supplied to the first input terminal T1 of the first unit logic gate, the input current IB is supplied to the other input terminal T1' of the first unit logic gate, and the input current IC is supplied to the other input terminal T1' of the second unit logic gate. When the bias current Ig is subsequently supplied to the second input terminals T2 of the first and second unit logic gates, an exclusive OR output $I(A \oplus B)$ of the input currents IA and IB is obtained from the output terminal T4 of the first unit logic gate, and an OR output $I(A+B)$ of the input currents IA and IB is obtained from the first input terminal T1 of the second unit logic gate. As a result of this, an exclusive OR output $I(A \oplus C + B \oplus C)$ of the input currents IA and IC or the input currents IB and IC is obtained from the output terminal T4, P1, or T2 of the second unit logic gate.

Figure 15:
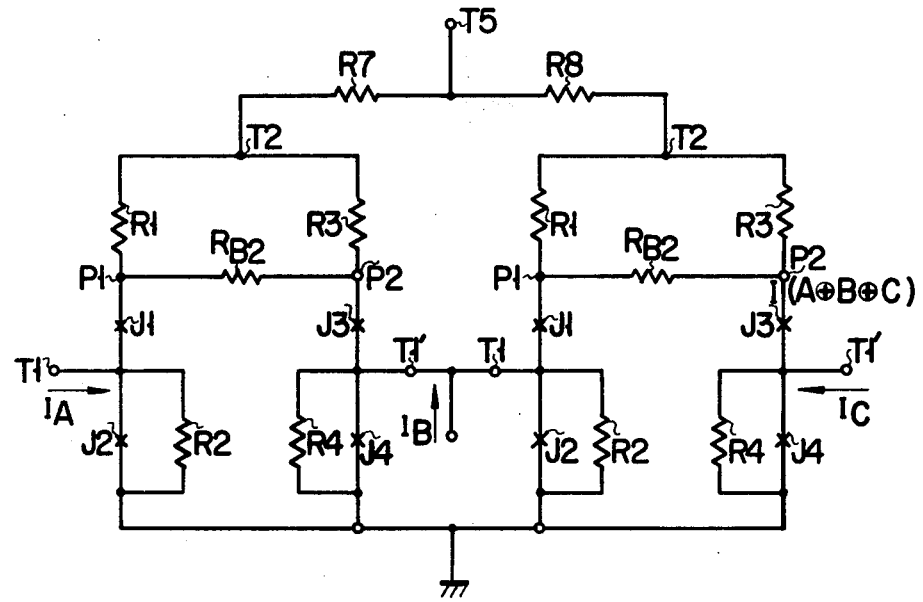
FIG. 15 is a circuit diagram showing still another embodiment based on the basic gate of FIG. 12.

FIG. 15 shows still another embodiment of the present invention wherein the other input terminal T1' of the first unit logic gate shown in FIG. 12 is connected to the first input terminal T1 of the second unit logic gate of the same circuit configuration, and the grounding terminals of both these gates are connected to each other. Further, the second input terminals T2 of the respective gates are connected through resistors R7 and R8, and the node thereof is connected to an output terminal T5. This logic gate realizes the exclusive OR function. In the logic gate of the configuration described above, the input current IA is supplied to the first input terminal T1 of the first unit logic gate, the input current IB is supplied to the input terminal which is the node of the other input terminal T1' of the first unit logic gate and the first input terminal T1 of the second unit logic gate, and the input current IC is supplied to the other input terminal T1' of the second unit logic gate. As a result, an exclusive OR current $I(A \oplus B \oplus C)$ of the input currents IA, IB and IC is output from the output terminal T4, P1, or T5 of the first and second unit logic gates.

The input and output terminals of the above-described embodiment may be determined in other ways than described above. For example, the input and output terminals may be interchanged as required.

Figure 16:
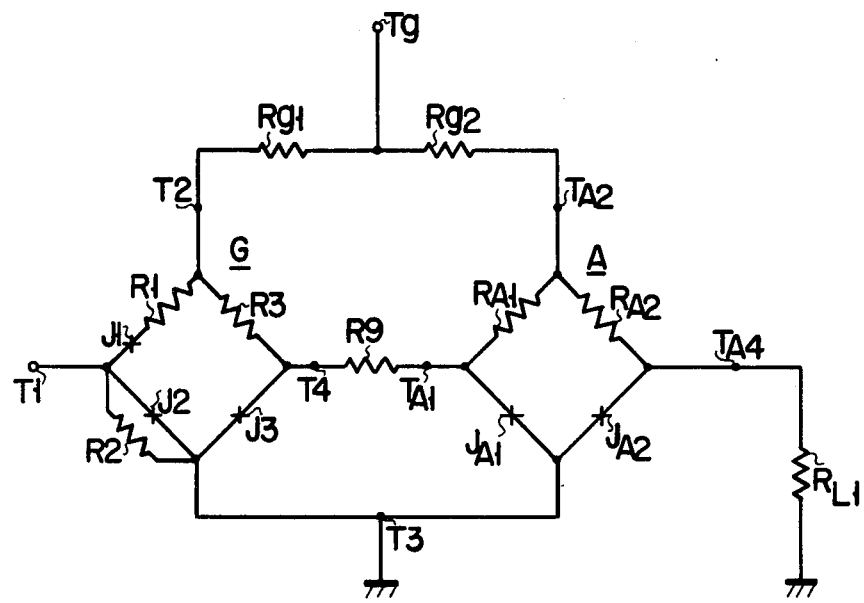
FIG. 16 is a circuit diagram showing an embodiment wherein to the basic logic gate of FIG. 1 is connected another logic gate as a current amplification stage.

FIG. 16 shows an embodiment of a logic gate wherein a current amplification stage is connected to the basic logic gate shown in FIG. 1 for obtaining a high output current. The output terminal T4 of a basic logic gate G is connected through a resistor R9 to an input terminal TA1 of a logic gate A of a current amplification stage. The logic gate A of the current amplification stage comprises a bridge circuit of branches respectively consisting of a resistor RA1, a resistor RA2, a Josephson junction JA1 connected to the input terminal TA1 and the grounding terminal T3, and another Josephson junction JA2 connected between an output terminal TA4 and the grounding terminal T3. The resistors RA1 and RA2 divide the bias current fed from an input terminal TA2. A load RL1 is connected between the output terminal TA4 and ground. The other input terminals T2 and TA2 of the basic logic gate G and the current amplification stage logic gate A are connected to a bias current input terminal Tg through resistors Rg1 and Rg2, respectively.

In the logic gate of the configuration described above, a bias current is initially supplied to the bias current input terminal Tg which is of a level such that it alone cannot switch any Josephson junction of the basic logic gate G to the non-zero voltage state. Then, an input current is supplied to the input terminal T1. The second Josephson junction J2, the third Josephson junction J3, and the first Josephson junction J1 are switched to the non-zero voltage state in the order described above, and an output current is obtained at the output terminal T4. This output current is input at the input terminal TA1 of the logic gate A of the current amplification stage through the resistor R9. At this instant, the resistance between ground and the output terminal T4 of the basic logic gate G increases from $R1R3/(R1+R3)$ before the switching operation of the basic logic gate to $(R3+R4)$. Thus, the bias current component Ig which has been flowing through the basic logic gate G is reduced, and the bias current component flowing through the logic gate A of the current amplification stage through the resistor Rg2 increases. As a result, a first Josephson junction JA1 of the logic gate A is switched to the non-zero voltage state to have a high resistance by the input current from the input terminal TA1 obtained through the resistor R9 and the divided component of the bias current. Subsequently, the second Josephson junction JA2 is also switched to the non-zero voltage state to have a high resistance by the input current obtained from the input terminal TA1 and the bias current obtained through the resistor RA2.

Therefore, an output current is obtained from the output terminal TA4.

In this embodiment, the current output from the output terminal TA4 becomes IJ1+IJ3+IJA1+IJA2 provided that the resistance RSG of each Josephson junction after switching to the non-zero voltage state is sufficiently greater than the resistances of the resistors R1, R2, R3, R4, Rg1, Rg2, and RL. IJ1, IJ3, IJA1 and IJA2 are the critical superconductive currents flowing through the Josephson junctions J1, J3, JA1, and JA2.

Among the components of the output current, the value of IJA1+IJA2 may be made greater than the output current IJ1+IJ3 obtained at the output terminal T4 of the basic logic gate G. The value n of R1/R3(=IJ3/IJ1) is 2 to 3 when the operation margin is ±20 to ±30% and the output wire number is about 3 with a bias input current and an input current which allow a suitable operation margin in the basic logic gate G. Similarly, if the logic gate A of the current amplification stage is in operation, it may be considered that RA1/RA2(=IJA2/IJA1)=n.

If the bias input current is large, the logic gate A and the basic logic gate G have the same threshold voltage. Both gates A and G can be regarded as junctions in the cirucit of this invention. More specifically, the switching of the logic gate A which is effected after the basic logic gate G has been switched can be considered identical with the transferring of the Josephson junction JA2 to non-zero voltage state which takes place after the Josephson junction JA1 has been transferred to non-zero voltage state. A ratio of Rg1 to Rg2, which may preserve a desired operation margin is thus: Rg1/Rg2=(IJA1+IJA2)/(IJ1+IJ3)=n. Thus, Rg1/Rg2(=(IJA1+IJA2)/(IJ1+IJ3))=n.

From the above, the magnitude of the output obtained from the output terminal TA4 of the current amplification stage A becomes $(n+1)$ times the magnitude of the output obtained from the output terminal T4 of the basic logic gate G. Therefore, the output obtained in this case becomes about $(n+1)^2$ times the input.

FIG. 17 shows the circuit configuration of an embodiment wherein a logic gate A' of another current amplification stage is connected in addition to the logic gate A of the current amplification stage of FIG. 16. The output terminal TA4 of the logic gate A is connected to an input terminal TA1' of the logic gate A1' through a resistor R9'. An input terminal Tg of the logic gate A is connected to a bias input current terminal TA2' of the other logic gate A'. The grounding terminals T3 of both the logic gates A and A' are connected to each other, and an output terminal TA4' of the logic gate A' is grounded through the resistor RL1.

The critical value of the output current obtained from the output terminal TA4' of the other logic gate A' of this circuit configuration becomes (IJ1+IJ3+IJA1+IJA2+IJA1'+IJA2'). Since a gain of (n+1) is generally obtainable with one stage of gate for the same reasons as described above, a current gain of about $(n+1)^3$ may be obtained.

FIG. 18 shows an embodiment which is of the same circuit configuration as that shown in FIG. 16 except that an inductance L is connected in series with the resistor R9; thus, the description thereof will be omitted.

This embodiment is advantageous in that, due to the connection of the inductance L, the transformation of the Josephson junction J1 into the non-zero voltage state is facilitated after the transformation of the Josephson junction J3 of the basic logic gate G to the non-zero voltage state.

Figure 19:
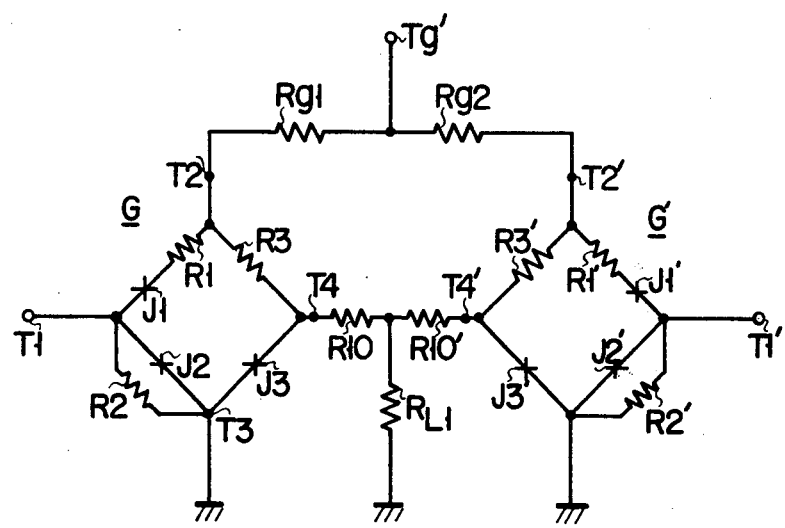
FIG. 19 is a circuit diagram showing another embodiment wherein the circuit same as the basic logic gate of FIG. 1 is connected symmetrically about the load resistor.

FIG. 19 shows still another embodiment of the present invention which combines two of the basic logic gates G and G' shown in FIGS. 16, 17 and 18, wherein the output terminals T4 and T4' of the two circuits are connected to each other and a node of resistors R10 and R10' is grounded through the resistor RL1. The bias current input terminals T2 and T2' of basic logic gates G and G' are connected to each other through the resistors Rg1 and Rg2, and the node of the resistors Rg1 and Rg2 is connected to a common bias current input terminal Tg'.

It is assumed that the input signal is supplied to the respective input terminals T1 and T1' under the condition that the bias current is supplied to the bias current input terminal Tg' according to this circuit configuration. When the Josephson junctions J2, J3, and J1 of the logic gate G are switched to the non-zero voltage state by the input current Ic and an output is obtained from the output terminal T4, the output flows to ground through the resistors R10 and RL1 and is simultaneously fed to the output terminal T4' of the other basic logic gate G' through the resistor R10' to a Josephson junction J3' for transforming it to the non-zero voltage state. On the other hand, when Josephson junctions J2', J3', and J1' of the basic logic gate G' are transformed to the voltage condition and an output is obtained from the output terminal T4', the output flows to ground through the resistors R10' and RL1 and is simultaneously input to the output terminal T4 of the other basic logic gate G through the resistor R10 to switch the Josephson junction J3 into the non-zero voltage state.

As a result, the bias current mainly flows through the first Josephson junctions J1, J1' of each of the basic logic gates G and G' to switch them to the non-zero voltage state and make them have high resistances. Thus, most of the bias current is output through the resistor RL1. Thus, according to this embodiment, the switching of the logic gate is facilitated even with a small input current to a plurality of input terminals T1 and T1' such that an output which is more than twice that of the output obtainable with a conventional single logic gate may be advantageously obtained.

A logic gate will be described referring to FIG. 20 which modifies the configuration of each branch of the bridge circuit shown in FIG. 1 constituting the basic logic gate of the present invention so as to realize the AND and majority OR functions. The first Josephson junction J1 constituting one branch of the bridge circuit is connected between the first input terminal T1 and ground. The first resistor R1 is connected between the second input terminal T2 and the first input terminal T1. The second resistor R2 is connected between the second input terminal T2 and the output terminal T4. The second Josephson junction J2 is connected between the output terminal T4 and ground. The load resistor RL1 is connected between the output terminal T4 and ground. It is assumed that the first and second Josephson junctions J1 and J2, the first and second resistors R1 and R2, and the load resistor RL1 hold the relation of R1, R2<<RL, RSG where RSG stands for the subgap resistance of the Josephson junctions J1 and J2 after the switching to the non-zero voltage state. According to the circuit configuration described above, when the input current IA is supplied to the first input terminal T1 alone, the current is divided by the first Josephson junction J1 and the resistor R1. When the input current IB is supplied to the second input terminal T2 alone, the current is divided by the first and second resistors R1 and R2. Thus, in either case, the second Josephson junction J2 cannot be switched into the non-zero voltage state. Thus, no logic operation may be performed. It is now assumed that the input current IA is supplied to the first input terminal T1 and the input current IB is simultaneously supplied to the second input terminal T2. In this case, components of the input currents IA and IB flow through the first Josephson junction J1 so that the junction J1 is switched to the non-zero voltage state and has a resistance RSG. The condition for effecting the switching to the non-zero voltage state may be represented by equation (8) below:

$$\frac{R2}{R1 + R2} IB + IA > IJ1 \quad (8)$$

where IJ1 stands for the critical superconductive current of the first Josephson junction J1.

When the first Josephson junction J1 is switched to the non-zero voltage state, it has a high resistance so that part of the first input current IA flows to the second Josephson junction J2 through the resistors R1 and R2. Since fraction of the first and second input currents IA and IB flows through the second Josephson junction J2, it is switched to the non-zero voltage state. The condition for switching the second Josephson junction J2 to the non-zero voltage state may be expressed by relation (9) below:

$$\frac{RSG}{R1 + R2 + RSG} IA + \frac{R1 + RSG}{R1 + R2 + RSG} IB > IJ2 \quad (9)$$

where IJ2 stands for the critical superconductive current of the second Josephson junction J2.

When the second Josephson junction J2 is switched to the non-zero voltage state, it has a high resistance. A current which is the sum of the first input current IA and the second input current IB flows from the output terminal T4. As a result, the circuit performs the AND function according to which an output may be obtained only when both the input currents IA and IB are simultaneously supplied. The operation margin for performing the AND function will be described with reference to FIG. 21.

The threshold value for switching the Josephson junction J1 to the non-zero voltage state is obtained from equation (8) and the threshold curve is represented by (a) of FIG. 21. The threshold value for switching the second Josephson junction J2 to the non-zero voltage state is obtained from equation (9), and the threshold curve may be respresented as (b) of FIG. 21. Therefore, the operation region for curves (a) and (b) corresponds to the crosshatched portion satisfying both curves (a) and (b) in FIG. 21. As may be apparent, this embodiment has a wide operation region. In this circuit, both the input currents IA and IB flow to the load after the gate has been switched. Thus, the output current generally becomes large since all the input currents may be utilized.

Figure 20:
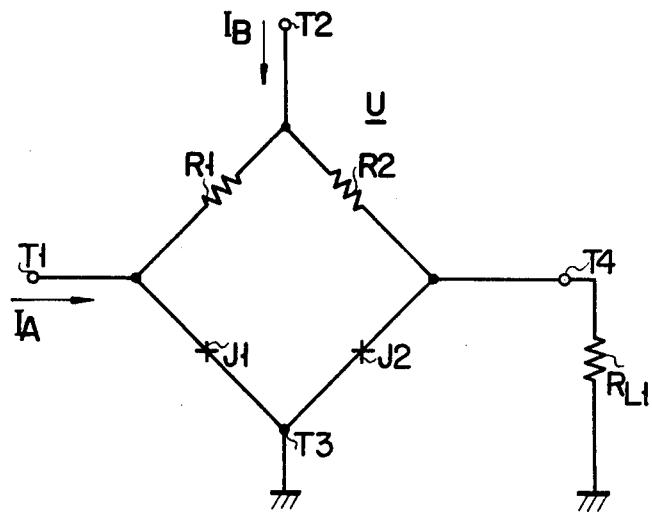
FIG. 20 is a circuit diagram of another basic logic gate according to still another embodiment of the present invention.

When a third input current IC different from the input currents IA and IB is supplied at the output terminal T4 in the circuit configuration of FIG. 20, a majority OR function may be obtained according to which an output current is obtained when the input current is supplied to any 2 or more of the input terminals T1, T2 and T4.

FIG. 22 shows an embodiment which is the same as that shown in FIG. 20 except that a bias resistor RB3 is connected between the node of the first Josephson junction J1 and the first resistor R1, and the node of the second Josephson junction J2 and the second resistor R2. The same reference numerals denote the same parts in FIG. 22 as in FIG. 20, and the description of the configuration will be omitted.

In summary, according to the present invention, the current components flowing through the second Josephson junction J2 are increased by the components flowing from the bias resistor RB3 so that the switching of the Josephson junction J2 to the voltage condition may be performed even when the values of the first input currents IA and IB are small. That is, this embodiment is advantageous in that the operation margin shown in FIG. 21 may be wide.

FIG. 23 shows still another embodiment of the present invention which is of the same circuit configuration as the embodiment of FIG. 20 except that the node of the first Josephson junction J1 and the first resistor R1 is grounded through a shunt resistor Rs. In this embodiment, if the resistance of the subgap RSG is great after the switching of the first Josephson junction J1 to the non-zero voltage state, by suitably selecting the resistance of the shunt resistor Rs, the value of the combined resistance of the subgap resistor RSG and the shunt resistor Rs may be determined to be a suitable value. Then, the current components flowing to the second Josephson junction J2 can be controlled for effecting its switching to the non-zero voltage state even when the input currents IA and IB are small. Thus, a wide operation margin may be obtained. The shunt resistor Rs may alternatively be connected between the output terminal T3 and ground.

FIG. 24 shows an embodiment based on the circuit configuration shown in FIG. 20, wherein the series circuit of the resistors R1 and R3 constitutes one branch of the bridge circuit in place of the first resistor R1, the series circuit of the Josephson junctions J1 and J3 constitutes another side of the bridge circuit in place of the first Josephson junction J1, and the series circuit of the Josephson junctions J2 and J4 constitutes still another side of the bridge circuit in place of the second Josephson junction J2.

According to this embodiment, the node of the resistors R1 and R3 may comprise an output terminal T6, and the other terminals T1, T2 and T4 may comprise input terminals. Further, the configuration need not be limited to this. Thus, which of the terminals comprise input or output terminals may be freely selected. Although a large output may be obtained as an AND output of the input currents IA and IB with the basic logic gate shown in FIG. 20, the electrical separation of the input terminals from the output terminal is difficult in this case. In order to solve this problem, the output terminals of basic logic gates G as shown in FIG. 1 may be connected to the first and second input terminals T1 and T2 of another basic logic gate, as shown in FIG. 25. According to this circuit configuration, the basic logic gate G acts as a buffer circuit and the input and output terminals may be electrically separated.

Various kinds of logic gates may be realized by using the basic logic gate shown in FIG. 20 or by suitably combining the basic logic gate shown in FIG. 20 with the basic logic gate shown in FIG. 1. An embodiment will now be described for realizing an exclusive OR function which is of the circuit configuration shown in FIG. 20, referring to FIG. 26. This embodiment is of the same circuit configuration as that of FIG. 20 except that the output terminal T3 is connected to the node of the first Josephson junction J1 and the second Josephson junction J2, and the load resistor RL2 is connected between the output terminal T3 and ground. The description of the circuit configuration will be omitted.

Considering the output terminal T3, when the input current IA is supplied to the first input terminal T1 and the input current IB is simultaneously supplied to the second input terminal T2, the AND output $I_{A \cdot B}$ is obtained from the output terminal T3, and both the first and second Josephson junctions J1 and J2 are switched to the non-zero voltage state to have high resistances so that no output current is obtained from the output terminal T4, as has already been described with reference to FIG. 20. However, when either the first input terminal T1 or the second input terminal T2 is supplied with the input current IA or the input current IB, respectively, the first Josephson junction J1 may be transformed to the non-zero voltage state depending upon the level of the input current, but the second Josephson junction J2 is never switched to the non-zero voltage state. Therefore, an output is not obtained at the output terminal T3, and the supplied input current, IA or IB, is obtained from the output terminal T4, allowing the exclusive OR function.

FIG. 27 shows an embodiment according to which the first input terminal T1 of the basic logic gate G shown in FIG. 1 is connected to the output terminal T3 of a basic logic gate U shown in FIG. 20. The logic function of this embodiment is such that an AND output is obtained from the output terminal T4 of the basic logic gate U, and an AND output including an exclusive OR output is obtained from the output terminal T4 of the basic logic gate G. Thus, when the input current IA is supplied to the first input terminal T1 and the input current IB is simultaneously supplied to the second input terminal T2, an AND output $I_{A \cdot B}$ is obtained from the output terminal T4. In this instance, an exclusive OR output $I_{A \oplus B}$ is obtained from the output terminal T4, which is supplied to the input terminal T1 of the basic logic gate G. When a bias current IT is supplied to the second input terminal T2 of the basic logic gate G, the exclusive OR output $I_{A \oplus B}$ and the AND output $I_{(A \oplus B) \cdot T}$ are output from the output terminal T4.

Figure 28:
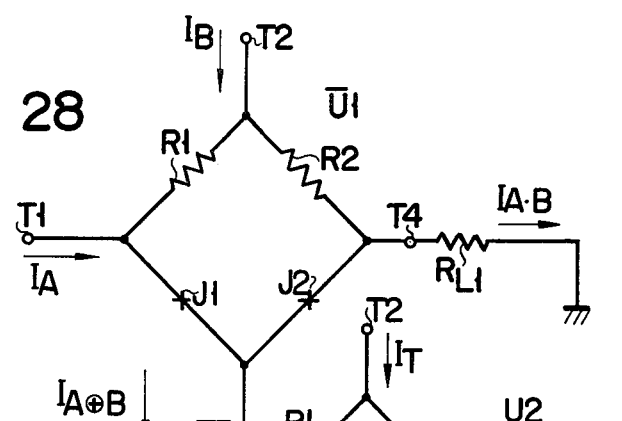
FIG. 28 is a circuit diagram of a logic gate wherein two basic logic gates of FIG. 20 are connected for realizing other logic functions.

FIG. 28 shows an embodiment of a circuit configuration according to which the grounding terminal T3 of a basic logic gate U1 of the configuration shown in FIG. 20 is connected to the first input terminal T1 of another basic logic gate U2 of the same configuration.

According to this embodiment, under the condition that the input current IA supplied to the input terminal T1 of the basic logic gate U1 and the input current IB supplied to the second input terminal T2 are always supplied before the bias current IT is supplied to the second input terminal T2 of the basic logic gate U2, an AND output $I_{A \cdot B}$ of the two input currents IA and IB is obtained from the output terminal T3 of the basic logic gate U1 and an AND output $I_{(A \oplus B) \cdot T}$ of the exclusive OR output $I_{A \oplus B}$ of IA and IB and the bias current IT is obtained from the output terminal T4 of the basic logic gate U2.

Figure 29:
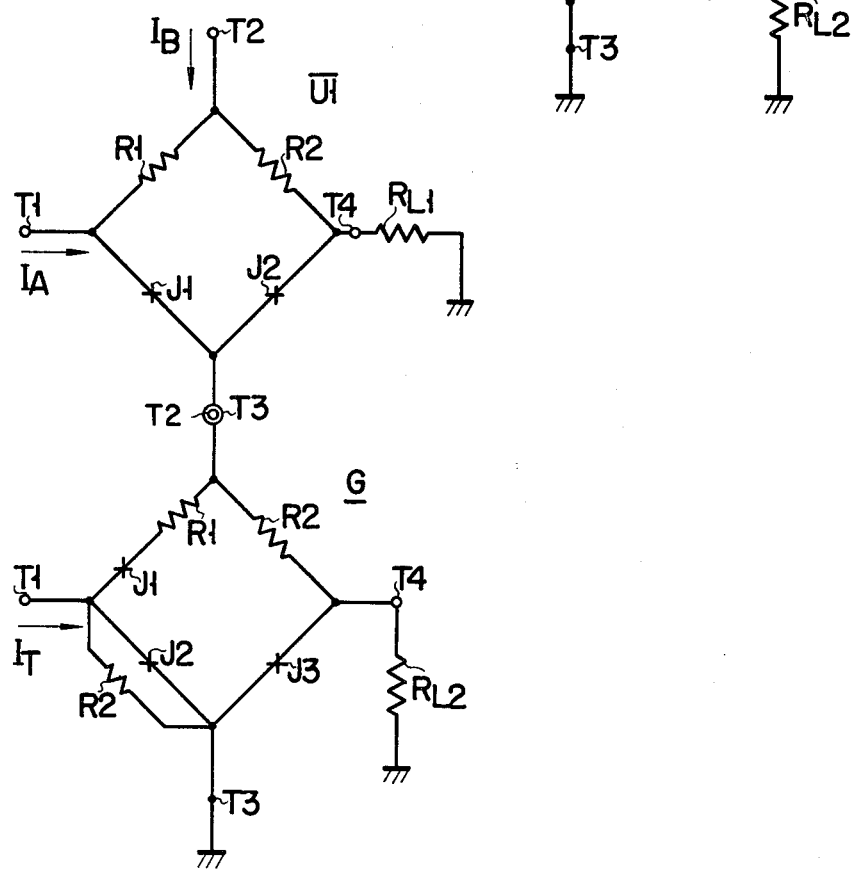
FIG. 29 is a circuit diagram of a logic gate which is connected to the basic logic gates of FIGS. 1 and 20 so that the separation of the input and output may be possible.

FIG. 29 shows an embodiment of the circuit configuration according to which the grounding terminal T3 of the basic logic gate U of FIG. 20 is connected to the second input terminal T2 of the basic logic gate G of FIG. 1. The logic function of this embodiment is the same as that of the embodiment shown in FIG. 28, so the description thereof will be omitted. However, this embodiment is advantageous in that erroneous operations are eliminated since the input current IT supplied to the input terminal T1 is electrically separated from the output current when the output is being obtained from the output terminal T4 of the basic logic gate G.

FIG. 30 shows still another embodiment of a circuit configuration for realizing the majority OR function.

A first basic logic gate G1 used in this embodiment is of the circuit configuration according to which the second resistor R2 connected in parallel with the second Josephson junction J2 shown in FIG. 1 is eliminated. A grounding terminal T3 of the first logic gate G1 is connected to the input terminal T1 of a second basic logic gate G2. This second logic gate G2 is of the same circuit configuration as shown in FIG. 1, and the bias current IT is supplied to the second input terminal T2. The output terminals T4 of the first and second basic logic gates G1 and G2 are commonly connected to the first input terminal of a third logic gate G3. This third logic gate G3 is of the circuit configuration according to which the first Josephson junction J1 connected in series with the first resistor R1 is eliminated from the circuit configuration shown in FIG. 1.

According to this embodiment, when the input current IA is supplied to the first input terminal T1 of the first basic logic gate G1 and the input current IB is supplied to the second input terminal T2, an AND output $I_{A \cdot B}$ obtained from the output terminal T3 and an AND output $I_{(A \oplus B) \cdot T}$ (of an exclusive OR output $I_{A \oplus B}$ input to the first input terminal T1 of the second basic logic gate G2 and the bias current IT input to the second input terminal T2) are supplied to the input terminal T1 of the third basic logic gate G3. When the bias current IB is further supplied to the second input terminal T2 of the third basic logic gate G3, a majority OR output $I_{(AB+BT+TA)}$ is obtained from the output terminal T4. Thus, the majority OR function is accomplished according to which an output is obtained when two or more input currents among the input currents IA, IB and IT are input.

The present invention is not limited to the particular embodiments described above, but various other logic functions may be realized by suitably combining a plurality of the basic logic gates. The connections of the input and output terminals in the bridge circuit may also be freely designed without being limited to the particular circuit configurations described above.

What we claimed is:

1. A superconductive logic circuit comprising:
   a basic logic gate, said basic logic gate including first and second input terminals connected at least at two nodes of a first bridge circuit having four branches;
   an output terminal connected at least at one node of said bridge circuit;
   a series circuit including a first resistor and a first Josephson junction connected between said first and second input terminals to comprise the first branch of said bridge circuit;
   a parallel circuit including a second resistor and a second Josephson junction connected between said first input terminal and a grounding terminal of said bridge circuit to comprise the second branch of said bridge circuit;

a third resistor connected between said second input terminal and one of said nodes of said bridge circuit to comprise the third branch of said bridge circuit; and a third Josephson junction connected between said node with the third resistor and said grounding terminal to comprise the fourth branch of said bridge circuit.

2. A superconductive logic circuit according to claim 1, wherein said second Josephson junction of said parallel circuit is switched to a non-zero voltage state when a total current from one of said input terminals and a fractional current from the other of said input terminals flow therethrough.

3. A superconductive logic circuit according to claim 1, wherein said third Josephson junction is switched to a non-zero voltage state when the total current from said first input terminal and the fractional current from said second input terminal flow therethrough.

4. A superconductive logic circuit according to claim 1, wherein said first Josephson junction is switched to a non-zero voltage state by the input current from said second input terminal after said second and third Josephson junctions have been switched to a non-zero voltage state.

5. A superconductive logic circuit according to claim 1, wherein said output terminal is connected through a load to ground.

6. A superconductive logic circuit according to claim 5, wherein said load comprises a superconductive circuit which includes a resistor and a Josephson junction.

7. A superconductive logic circuit according to claim 5, wherein said load comprises a resistor.

8. A superconductive logic circuit according to claim 5, wherein said load comprises a series circuit of a resistor and an inductor.

9. A superconductive logic circuit according to claim 1, wherein a node of said first Josephson junction and said first resistor of said series circuit is connected to an end of a bypass resistor and said output terminal is connected to another end of said bypass resistor, and a load is connected between said output terminal and ground.

10. A superconductive logic circuit according to claim 9, wherein said load comprises a superconductive circuit which includes a resistor and a Josephson junction.

11. A superconductive logic circuit according to claim 9, wherein said load comprises a resistor.

12. A superconductive logic circuit according to claim 10, wherein said load comprises a series circuit of a resistor and an inductor.

13. A superconductive logic circuit according to claim 1, wherein a node of said first Josephson junction and said first resistor of said series circuit is connected to an end of a bypass resistor, said output terminal is connected to another end of said bypass resistor; a load is connected between said output terminal and ground; and said second resistor of said parallel circuit comprises a series circuit of a resistor and an inductor.

14. A superconductive logic circuit according to claim 13, wherein said node of said first Josephson junction and said first resistor of said series circuit is connected to another input terminal.

15. A superconductive logic circuit according to claim 1, wherein said output terminal comprises a first output terminal arranged at a node of said third resistor and said third Josephson junction for obtaining an AND output, and a second output terminal arranged at a node of said parallel circuit and said third Josephson junction for obtaining an OR output.

16. A superconductive logic circuit according to claim 13, wherein said second output terminal for obtaining said OR output is connected to one of input terminals of another basic logic gate.

17. A superconductive logic circuit according to claim 1, wherein a parallel circuit of a fourth Josephson junction and a fourth resistor is further connected between said third Josephson junction and said node connected to the grounding terminal.

18. A superconductive logic circuit according to claim 16, wherein a node of said series circuit of said first Josephson junction and said first resistor is connected to one end of a bypass resistor and the other end of said bypass resistor is connected to a node of said third Josephson junction and said third resistor.

19. A superconductive logic circuit according to claim 17, wherein to a first series circuit of said third resistor and said parallel circuit comprising said fourth Josephson junction and said fourth resistor is connected in parallel a second series circuit of another resistor and another parallel circuit identical to those of said first series circuit.

20. A superconductive logic circuit according to claim 16, wherein a node of said grounding terminal and said parallel circuit comprised of said fourth Josephson junction and said fourth resistor is connected to a first input terminal of another basic logic gate, and a parallel circuit of a fourth Josephson junction and a fourth resistor is connected between a third Josephson junction and a grounding terminal in said other basic logic gate.

21. A superconductive logic circuit according to claim 17, wherein a node of said third Josephson junction and said parallel circuit consisting of said fourth Josephson junction and said fourth resistor is connected to an input terminal of another basic logic gate, and a bypass resistor is connected between a node between said third Josephson junction and said third resistor and a node between said first Josephson junction and said first resistor.

22. A superconductive logic circuit according to claim 1, wherein a logic circuit of at least one current amplification stage is connected to said output terminal of said basic logic gate, said logic gate of said current amplification state comprises a bridge circuit having a bias current input terminal connected to a bias current input terminal of said basic logic gate, a current input terminal and a grounding terminal respectively connected to said output terminal and said grounding terminal of said basic logic gate, and an output terminal and said logic gate further comprises a first resistor and a second resistor for dividing a bias current input to said bias current input terminal and comprising two branches of said bridge circuit, a first Josephson junction connected between said output current terminal and said grounding terminal and comprising another branch, and a second Josephson junction connected between said grounding terminal and said output terminal and comprising still another branch.

23. A superconductive logic circuit according to claim 21, wherein further a resistance is connected between said output terminal of said basic logic gate and said input terminal of said logic gate of said current amplification stage.

24. A superconductive logic circuit according to claim 22, wherein said further resistance comprises a series circuit of an inductor and a resistor.

25. A superconductive logic circuit according to claim 21, wherein said basic logic gate has at least another basic logic gate comprising a bridge circuit of the same configuration commonly connected to said output terminal one of and said input terminals.

26. A superconductive logic circuit according to claim 1, forming an injection current-controlled basic circuit, wherein said output terminal of said first bridge circuit is connected to a second bridge circuit having a first and a second input terminal connected at least at two nodes and having four branches and an output terminal connected at least at one node of said second bridge circuit;

said second bridge circuit comprising:
a first branch connected between said first and second input terminals of the second bridge circuit and having a first resistor;
a second branch connected between said first input terminal and a grounding terminal of said second bridge circuit and having a first Josephson junction;
a third branch connected between said second input terminal and said output terminal of said second bridge circuit and having a second resistor; and
a fourth branch connected between said output terminal and said grounding terminal of said second bridge circuit and having a second Josephson junction; and
said second input terminal of said second bridge circuit being connected to a third bridge circuit having a first and a second input terminal connected at least at two nodes and having four branches and an output terminal connected at least at one node of said third bridge circuit;

said third bridge circuit comprising:
a first branch connected between said first and second input terminals of the third bridge circuit and having a first resistor and a first Josephson junction;
a second branch connected between said first input terminal and a grounding terminal of the third bridge circuit and having a parallel circuit comprising a second Josephson junction and a second resistor;
a third branch connected between said second input terminal and said output terminal of the third bridge circuit and having a third resistor; and
a fourth branch connected between said output terminal and said grounding terminal of the third bridge circuit;
said output terminals of said first and third bridge circuits being individually connected to said first and second input terminals of said second bridge circuit, the input and output terminals of said second bridge circuit being electrically separated whereby said first and third bridge circuits operate as buffer circuits.

27. A superconductive logic circuit according to claim 1, forming an injection current-controlled basic circuit, wherein said first input terminal of said first bridge circuit is connected to a second bridge circuit having a first and a second input terminal connected at least at two nodes and having four branches and a first and a second output terminal connected at two nodes of said second bridge circuit;

said second bridge circuit comprising:
a first branch connected between said first and second input terminals of the second bridge circuit and having a first resistor;
a second branch connected between said first input terminal and a grounding terminal of said second bridge circuit and having a first Josephson junction;
a third branch connected between said second input terminal and said output terminal of said second bridge circuit and having a second resistor; and
a fourth branch connected between said first and second output terminals of said second bridge circuit and having a second Josephson junction;
said second output terminal of said second bridge circuit being connected to the first input terminal of the first bridge circuit so that when an input IA is applied to said first input terminal of said second bridge circuit and when an input IB is applied to said second input terminal of said second bridge circuit, an AND output I $(A \oplus B) \cdot T$ is obtained from the output terminal of said first bridge circuit by applying a bias input IT to said second input of said first bridge circuit.

28. A superconductive logic circuit according to claim 1, forming an injection current-controlled basic circuit, wherein said second input terminal of said first bridge circuit is connected to a second bridge circuit having a first and a second input terminal connected at least at two nodes and having four branches and an output terminal connected at least at one node of said second bridge circuit;

said second bridge circuit comprising:
a first branch connected between said first and second input terminals of the second bridge circuit and having a first resistor;
a second branch connected between said first input terminal and a grounding terminal of said second bridge circuit and having a first Josephson junction;
a third branch connected between said second input terminal and said output terminal of said second bridge circuit and having a second resistor; and
a fourth branch connected between said grounding and output terminals of said second bridge circuit and having a second Josephson junction;
said second output terminal of the second bridge circuit being connected to the second input terminal of said first bridge circuit so that when a first input IA is applied to said first input terminal of said second bridge circuit and when a second input IB is applied to said second input terminal of said second bridge circuit, an AND output I $(A \oplus B) \cdot T$ is obtained from the output terminal of said first bridge circuit by applying a bias input IT to said first input terminal of said first bridge circuit.

29. A superconductive logic circuit according to claim 1, forming an injection current-controlled logic circuit, wherein said first input terminal of said first bridge circuit is connected to a second bridge circuit having a first and a second input terminal connected at least at two nodes and having four branches and an output terminal connected at least at one node of said second bridge circuit;

said second bridge circuit comprising:
a first branch connected between said first and second input terminals of the second bridge circuit and having a first resistor and a first Josephson junction;
a second branch connected between said first input terminal and a grounding terminal of said second bridge circuit and having a second Josephson junction;
a third branch connected between said second input terminal and said output terminal of said second bridge circuit and having a second resistor; and
a fourth branch connected between said output terminal and said grounding terminal of said second bridge circuit and having a third Josephson junction;
said grounding terminal of said second bridge circuit being connected to said first input terminal of said bridge circuit and said output terminals of said first and second bridge terminals being commonly connected to a third bridge circuit having a first and a second input terminal connected at least at two nodes and having four branches and an output terminal connected at least at one node of said third bridge circuit;
said third bridge circuit comprising:
a first branch connected between said first and second input terminals of said third bridge circuit and having a first resistor;
a second branch connected between said first input terminal and a grounding terminal of said third bridge circuit and having a parallel circuit comprising a second Josephson junction and second resistor;
a third branch connected between said second input terminal and said output terminal of said third bridge circuit and having a third resistor; and
a fourth branch connected between said output terminal and said grounding terminal of said third bridge circuit and having a third Josephson junction;
said first input terminal of said first bridge circuit being connected to said output terminal of said second bridge circuit so that when a first input IA is applied to said first input of said second bridge circuit and a second input IB is applied to said second input terminal of said second bridge circuit, and when a bias input IT is applied to said second input terminal of said first circuit and a bias input IBias is applied to said second input terminal of said third bridge circuit, a majority OR output is obtained from the output terminal of said third bridge circuit by applying a bias signal IT to said second input terminal of said first bridge circuit.

* * * * *

UNITED STATES PATENT AND TRADEMARK OFFICE
CERTIFICATE OF CORRECTION

PATENT NO. : 4,482,821

DATED : November 13, 1984

INVENTOR(S) : Kouji HOUKAWA et al

It is certified that error appears in the above-identified patent and that said Letters Patent is hereby corrected as shown below:

COLUMN 2, line 10, after "includes" delete "of";

COLUMN 21 (claim 12), line 50, change "claim 10" to --claim 9--;

COLUMN 22 (claim 16), line 4, change "claim 13" to --claim 15--;

COLUMN 22 (claim 18), line 13, change "claim 16" to --claim 17--;

COLUMN 22 (claim 20), line 26, change "claim 16" to --claim 17--;

COLUMN 22 (claim 22), line 46, change "state" to --stage--;

COLUMN 22 (claim 23), line 62, change "further a" to --a further--;

COLUMN 23 (claim 25), line 5, change "one of and" to --and one of--;

COLUMN 25, line 11, after "terminal of said" insert --first--.

Signed and Sealed this

Twenty-third Day of July 1985

[SEAL]

Attest:

DONALD J. QUIGG

Attesting Officer     Acting Commissioner of Patents and Trademarks